United States Patent
Iwaki et al.

(10) Patent No.: US 8,378,760 B2
(45) Date of Patent: Feb. 19, 2013

(54) DUPLEXER, COMMUNICATION MODULE, AND COMMUNICATION DEVICE

(75) Inventors: Masafumi Iwaki, Tokyo (JP); Jun Tsutsumi, Tokyo (JP); Tokihiro Nishihara, Tokyo (JP); Masanori Ueda, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 13/563,510

(22) Filed: Jul. 31, 2012

(65) Prior Publication Data

US 2012/0293276 A1    Nov. 22, 2012

Related U.S. Application Data

(63) Continuation of application No. PCT/JP2010/072520, filed on Dec. 15, 2010.

(30) Foreign Application Priority Data

Feb. 1, 2010    (JP) .................................. 2010-020353

(51) Int. Cl.
*H03H 7/46* (2006.01)
*H03H 9/70* (2006.01)

(52) U.S. Cl. ......................... 333/129; 333/132; 333/133

(58) Field of Classification Search .................. 333/126, 333/129, 132, 133
See application file for complete search history.

(56) References Cited

U.S. PATENT DOCUMENTS

| | | | |
|---|---|---|---|
| 7,733,196 B2 * | 6/2010 | Tsurunari et al. | 333/133 |
| 2002/0014121 A1 | 2/2002 | Urabe et al. | |
| 2010/0026419 A1 * | 2/2010 | Hara et al. | 333/175 |
| 2010/0060372 A1 | 3/2010 | Funahashi et al. | |
| 2010/0150075 A1 | 6/2010 | Inoue et al. | |
| 2010/0244979 A1 * | 9/2010 | Matsuda et al. | 333/100 |
| 2011/0254639 A1 * | 10/2011 | Tsutsumi et al. | 333/132 |

FOREIGN PATENT DOCUMENTS

| | | |
|---|---|---|
| JP | 2002-76829 A | 3/2002 |
| JP | 2006-60747 A | 3/2006 |
| WO | 2008/146552 A1 | 12/2008 |
| WO | 2009/025106 A1 | 2/2009 |

OTHER PUBLICATIONS

Written Opinion (PCT/ISA/237) issued in PCT/JP2010/072520 mailed in Mar. 2011.
International Search Report (ISR) issued in PCT/JP2010/072520 mailed in Mar. 2011.

* cited by examiner

*Primary Examiner* — Barbara Summons
(74) *Attorney, Agent, or Firm* — Chen Yoshimura LLP

(57) ABSTRACT

A duplexer includes an unbalanced transmitting filter; a balanced receiving filter; a transmitting port connected to the transmitting filter; and a first receiving port and a second receiving port connected to the receiving filter. The duplexer also includes an electromagnetic coupling portion connected between the transmitting port and the first receiving port and between the transmitting port and the second receiving port. The electromagnetic coupling portion adjusts the phase between electric power that flows from the transmitting port to the first receiving port and electric power that flows from the transmitting port to the second receiving port.

6 Claims, 31 Drawing Sheets

Differential isolation

Electric power transmission characteristics of paths from transmitting port Tx to two receiving ports Rx1, Rx2 in terms of phase Electric power transmission characteristics of paths from transmitting port Tx to two receiving ports Rx1, Rx2 in terms of phase difference

DUPLEXER, COMMUNICATION MODULE, AND COMMUNICATION DEVICE

CROSS-REFERENCE TO RELATED APPLICATION

This application is based upon and claims the benefit of priority of the prior Japanese Patent Application No. 2010-020353, filed on Feb. 1, 2010, the entire contents of which are incorporated herein by reference.

FIELD

The disclosure of the present application relates to a duplexer, a communication module, and a communication device.

BACKGROUND

From the viewpoint of achieving high-capacity data communication at a higher speed, there has been a trend in recent years in mobile terminals for high frequency communication toward an increase in the transmission signal power. In a mobile terminal, an increase in the signal power may result in deterioration of isolation of the duplexer. Theoretically, it is possible to improve the isolation of the duplexer by configuring a transmitting filter or receiving filter used in the duplexer to have an increased attenuation in the opposite band (the receiving band for the transmitting filter and the transmitting band for the receiving filter). In reality, however, the isolation becomes saturated at a certain level. The reason for this because not only a current that flows through the filters but also a current that flows through the duplexer via space serve as components having an influence on the isolation. In order to achieve a high level of isolation, it is desirable to study measures against the current that flows through the duplexer via space.

Examples of effective configurations in removing the influence of the current that flows through the duplexer via space, in other words, the influence of electromagnetic coupling components include increasing the physical distance between a source and a target to be coupled and placing an electromagnetic shielding structure. Patent Document 1 discloses a surface acoustic wave device in which a shield electrode is disposed between two surface acoustic wave filter patterns. Patent Document 2 discloses a surface acoustic wave device in which an input external terminal and an output external terminal are disposed apart from each other diagonally.

Patent Documents
  Patent Document 1: JP 2006-60747 A
  Patent Document 2: JP 2002-76829 A In the case of the configuration disclosed in Patent Document 1, adequate improvements in the isolation may be achieved by increasing the size of the shielding member. However, an increase in the size of the shielding member may impair a downsizing of the duplexer. Further, in the case of the configuration disclosed in Patent Document 2, adequate improvements in the isolation may be achieved by increasing the distance between the input external terminal and the output external terminal. However, an increase in the distance between the terminals may impair a downsizing of the duplexer. The inventors realized that with the configurations disclosed in Patent Documents 1 and 2, it is difficult to achieve both the downsizing of the duplexer and improvements in the isolation.

SUMMARY

The duplexer disclosed in the present application includes: an unbalanced transmitting filter; a balanced receiving filter; a transmitting port connected to the transmitting filter; a first receiving port connected to the receiving filter; a second receiving port connected to the receiving filter; and an electromagnetic coupling portion connected between the transmitting port and the first receiving port and between the transmitting port and the second receiving port. The electromagnetic coupling portion allows phase-adjusted electric power to flow from the transmitting port to the first receiving port and from the transmitting port to the second receiving port.

The object and advantages of the invention will be realized and attained by means of the elements and combinations particularly pointed out in the appended claims. It is to be understood that both the foregoing general description and the following detailed description are exemplary and explanatory only and are not restrictive of the invention, as claimed.

EMBODIMENT 1

[1. Configuration Example of Duplexer]

Figure 1:
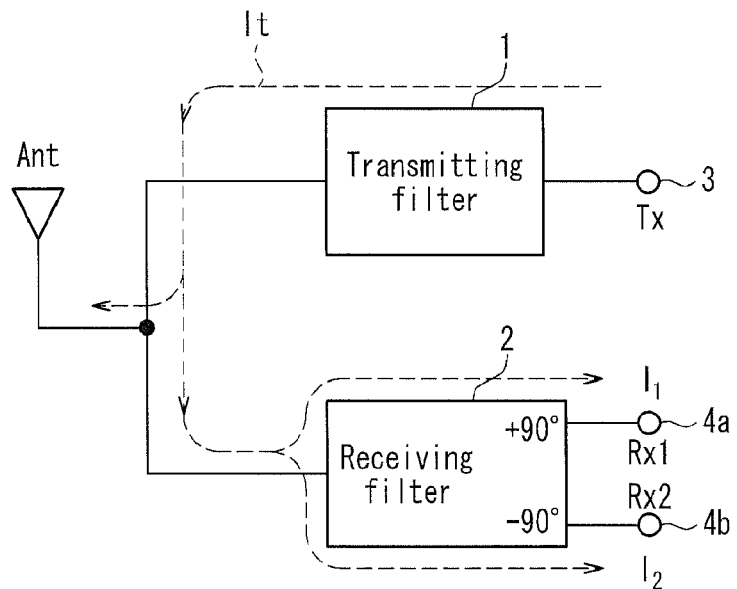
FIG. 1 is a block diagram of an example of a duplexer.

FIG. 1 is a block diagram of a balanced-unbalanced duplexer using film bulk acoustic resonators or acoustic wave resonators. As shown in FIG. 1, the duplexer includes a transmitting filter 1, a receiving filter 2, a transmitting port 3, and receiving ports 4a and 4b. The duplexer shown in FIG. 1 is of a balanced-unbalanced type and includes one transmitting port 3 and two receiving ports 4a and 4b.

As shown in FIG. 1, in the balanced-unbalanced duplexer, a current It inputted to the transmitting port 3 partially flows into an antenna port Ant and also flows into the receiving filter 2. The receiving filter 2 is of an unbalanced input-balanced output type, and is configured to phase-shift one of the balanced outputs by +90° and the other of the balanced outputs by −90°. Thus, a current I1 that flows into the receiving port 4a and a current I2 that flows into the receiving port 4b have a phase difference of 180°. Thus, to the receiving ports 4a and 4b, currents having opposite phases are outputted in the receiving band (hereinafter referred to as the Rx band) and in-phase currents are outputted in other frequency bands.

Figure 2:
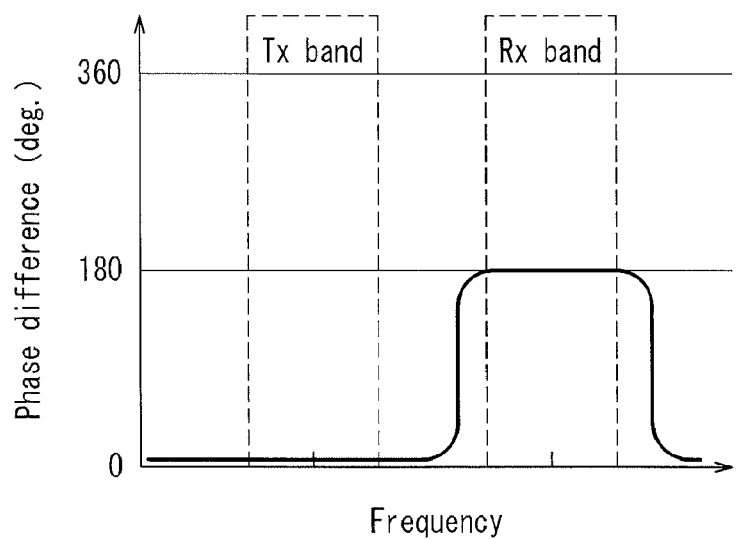
FIG. 2 is a graph showing an example of a phase difference between currents that flow to two receiving ports from a transmitting port.

FIG. 2 shows the relationship between currents that flow into the two receiving ports 4a and 4b in the duplexer shown in FIG. 1. As shown in FIG. 2, currents having a phase difference of 180° are outputted from the receiving filter 2 in the Rx band.

Figure 3A:
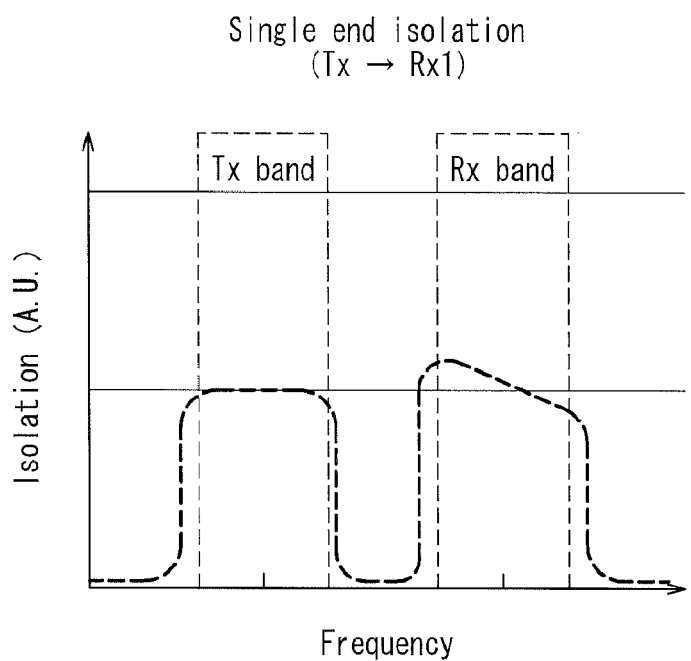
FIG. 3A is a graph showing an example of SEI of the duplexer.
Figure 3B:
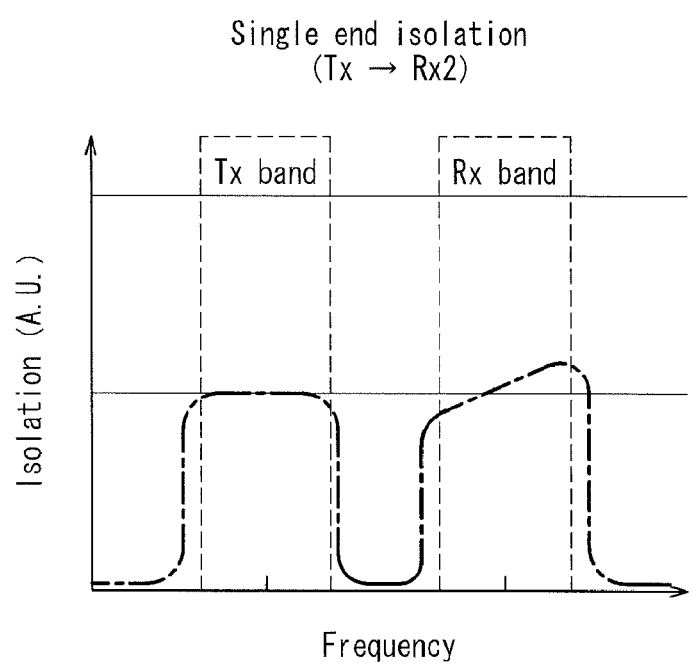
FIG. 3B is a graph showing an example of SEI of the duplexer.
Figure 3C:
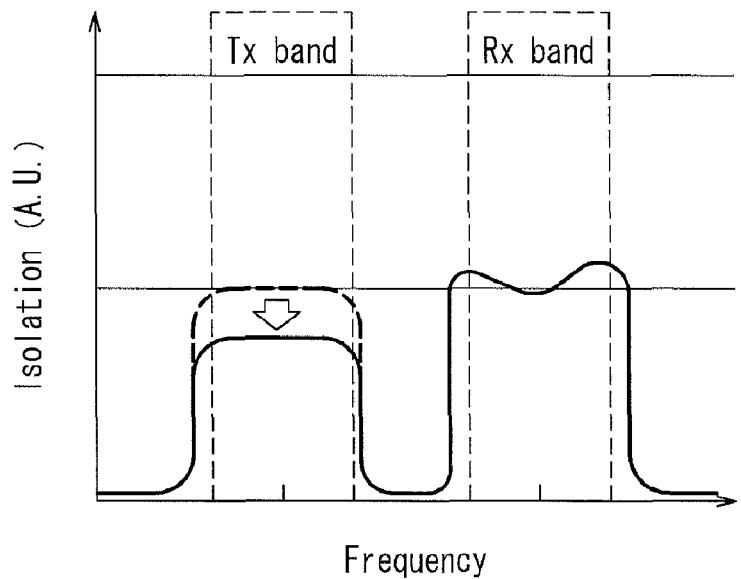
FIG. 3C is a graph showing an example of DI of the duplexer.

FIG. 3A and 3B each show isolation with respect to a single path (hereinafter referred to as single end isolation, and SEI for short) of a duplexer having the current characteristic as shown in FIG. 2. FIG. 3A shows the isolation from the transmitting port 3 to the receiving port 4a. FIG. 3B shows the isolation from the transmitting port 3 to the receiving port 4b. FIG. 3C shows differential isolation (hereinafter referred to as DI for short) of the duplexer having the current characteristic as shown in FIG. 2. The differential isolation is obtained by synthesizing the isolations of the two paths with a balun. As shown in FIG. 3C, SEI and DI have a small level difference in the Rx band where currents having opposite phases are outputted. The reason for this is that currents having opposite phases are outputted in the Rx band and they do not cancel each other even if they pass through a balun in the receiving filter 2. On the other hand, DI shows better characteristics than those of SEI in the Tx band where in-phase currents are outputted. The reason for this is that in-phase currents cancel each other in the differential operation, i.e., when they pass through the balun.

However, these are only ideal cases. In reality, a coupling may occur through space as described above. As described above, there are components that propagate to the receiving ports 4a and 4b from the transmitting port 3 due to an electrostatic/electromagnetic coupling. Hereinafter, such a electrostatic/electromagnetic coupling will be referred to as an "electromagnetic coupling." That is, electromagnetic coupling may include at least one of electrostatic coupling or electromagnetic coupling.

Figure 4:
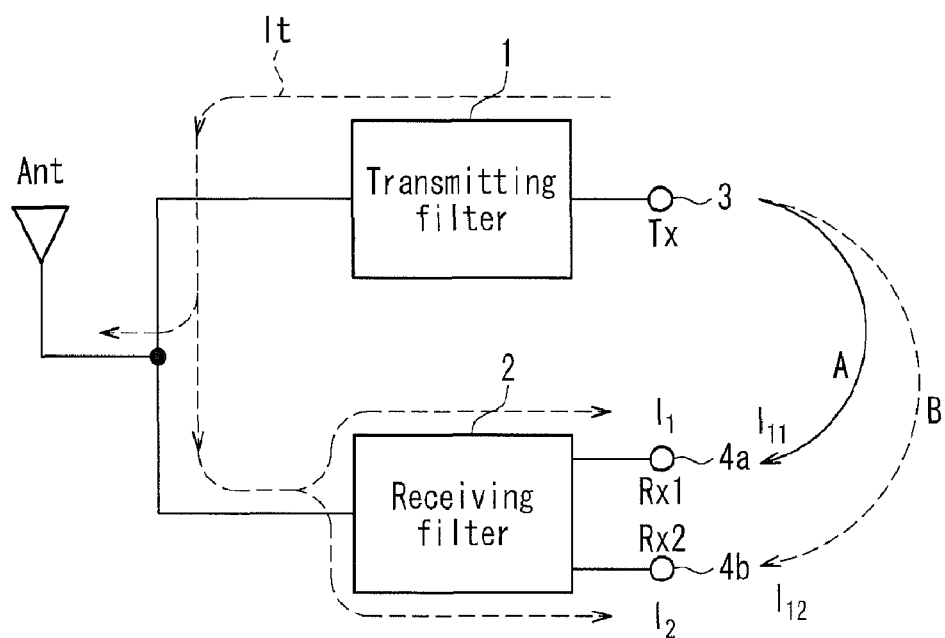
FIG. 4 is a block diagram schematically showing an example of the occurrence of an electromagnetic coupling in a duplexer.

FIG. 4 is a diagram for explaining the principles of an electromagnetic coupling between the transmitting port 3 and the receiving port 4a and that between the transmitting port 3 and the receiving port 4b in the duplexer. As shown in FIG. 4, when the duplexer is in the operating state, an electromagnetic coupling occurs between the transmitting port 3 and the receiving port 4a spatially as indicated by the arrow A, so that a current I11 flows to the receiving port 4a from the transmitting port 3. Further, an electromagnetic coupling occurs between the transmitting port 3 and the receiving port 4b spatially as indicated by the arrow B, so that a current I12 flows to the receiving port 4b from the transmitting port 3. In this way, if the transmitting port 3 and the receiving port 4a and the transmitting port 3 and the receiving port 4b are electromagnetically coupled, the isolation deteriorates.

Figure 5A:
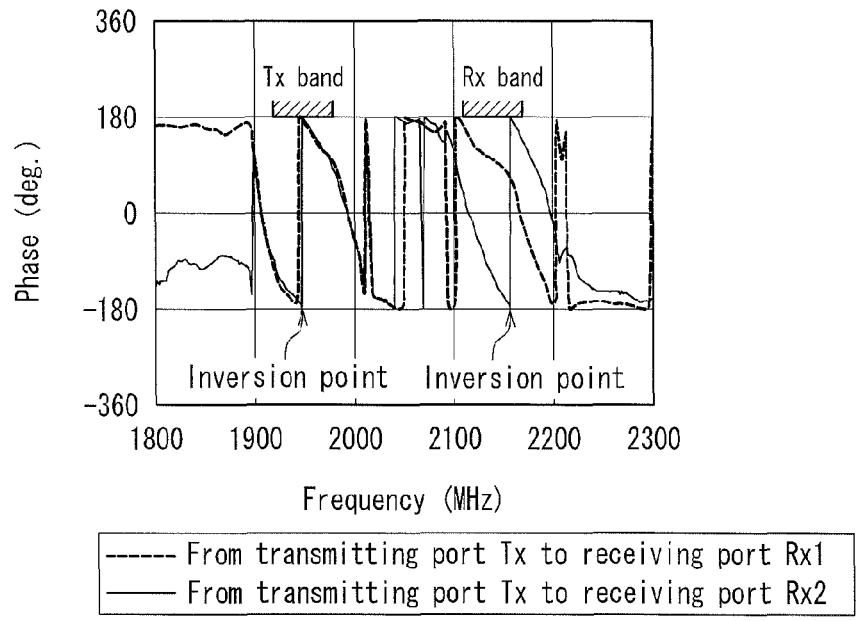
FIG. 5A is a graph showing an example of electric power transmission characteristics of the paths from the transmitting port to the two receiving ports in terms of phase.
Figure 5B:
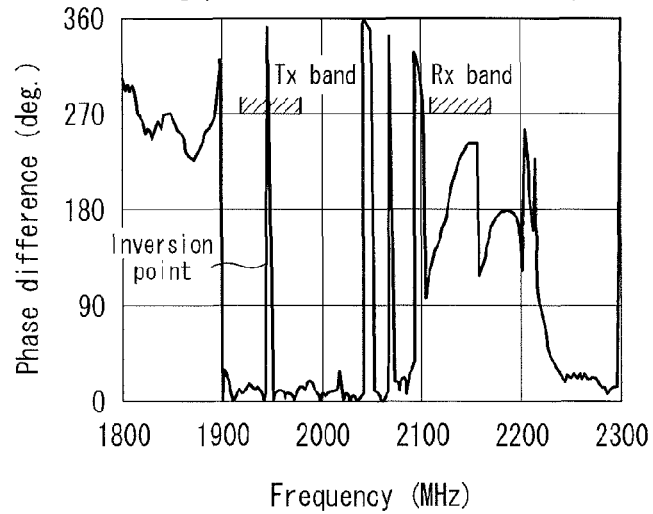
FIG. 5B is a graph showing an example of electric power transmission characteristics of the paths from the transmitting port to the two receiving ports in terms of phase difference.

FIG. 5A shows electric power characteristics of the paths from the transmitting port 3 to the receiving ports 4a and 4b in the duplexer shown in FIG. 4 in terms of phase. FIG. 5B shows electric power characteristics of the paths from the transmitting port 3 to the receiving ports 4a and 4b in the duplexer shown in FIG. 4 in terms of phase difference. As shown in FIG. 5B, a phase difference between electric power transmitted from the transmitting port 3 to the receiving port 4a and electric power transmitted from the transmitting port 3 to the receiving port 4b is roughly 0° in the Tx band. However, in the Rx band, the phase difference deviates from 180° as an ideal value. The phase difference deviation occurs in the Rx band because there is a possibility of an electromagnetic coupling between the transmitting port 3 and the receiving port 4a and an electromagnetic coupling between the transmitting port 3 and the receiving port 4b.

Figure 6A:
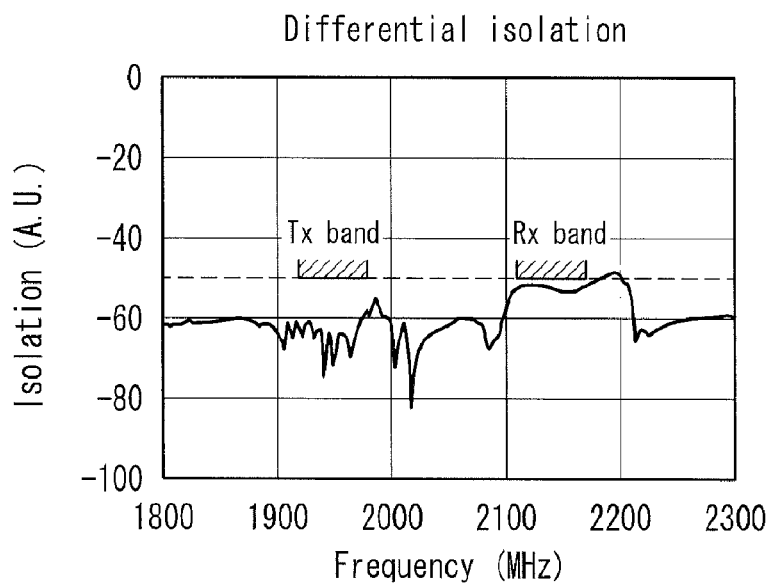
FIG. 6A is a graph showing an example of DI of the duplexer.
Figure 6B:
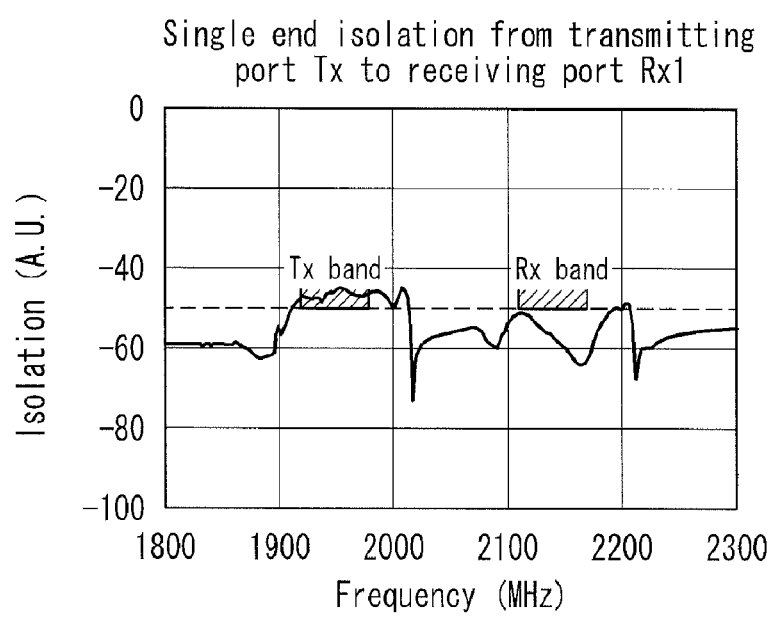
FIG. 6B is a graph showing an example of SEI of the duplexer.
Figure 6C:
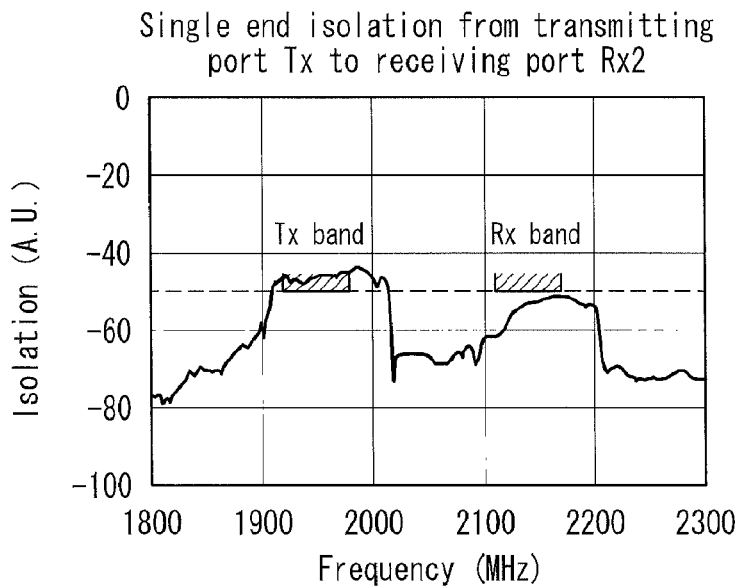
FIG. 6C is a graph showing an example of SEI of the duplexer.

FIG. 6A shows DI characteristics of the duplexer shown in FIG. 4. FIG. 6B shows SEI characteristics between the transmitting port 3 and the receiving port 4a in the duplexer shown in FIG. 4. FIG. 6C shows SEI characteristics between the transmitting port 3 and the receiving port 4b in the duplexer shown in FIG. 4. When there is a possibility of an electromagnetic coupling between the transmitting port 3 and the receiving port 4a and an electromagnetic coupling between the transmitting port 3 and the receiving port 4b in the duplexer as shown in FIG. 4, DI (see FIG. 6A) deteriorates more so than SEI (see FIGS. 6B and 6C) in the Rx band.

Figure 7:
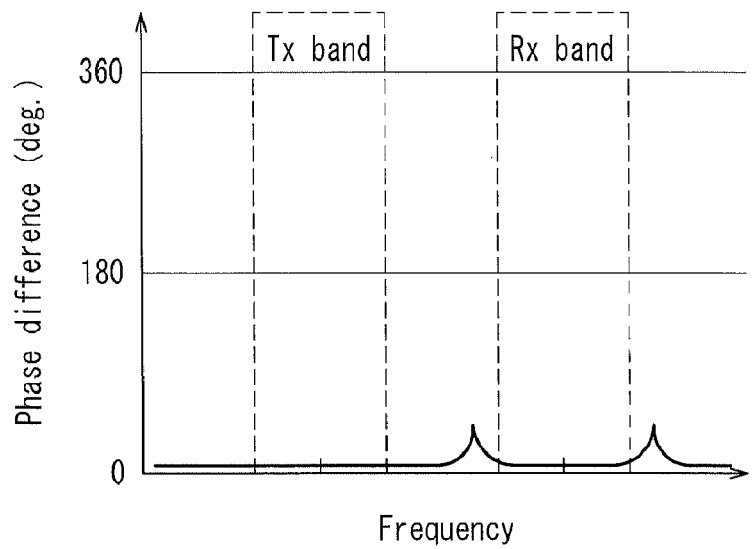
FIG. 7 is a graph showing an example of a phase difference between currents that flow to the two receiving ports from the transmitting port.
Figure 8A:
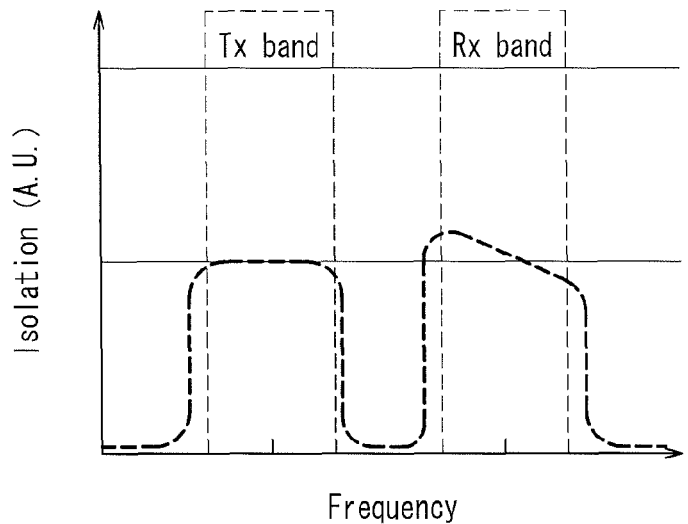
FIG. 8A is a graph showing an example of SEI from the transmitting port and the receiving port.
Figure 8B:
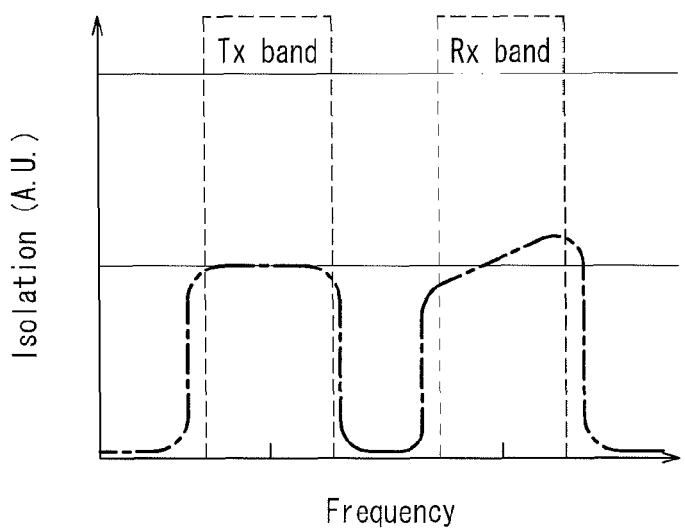
FIG. 8B is a graph showing an example of SEI from the transmitting port and the receiving port.
Figure 8C:
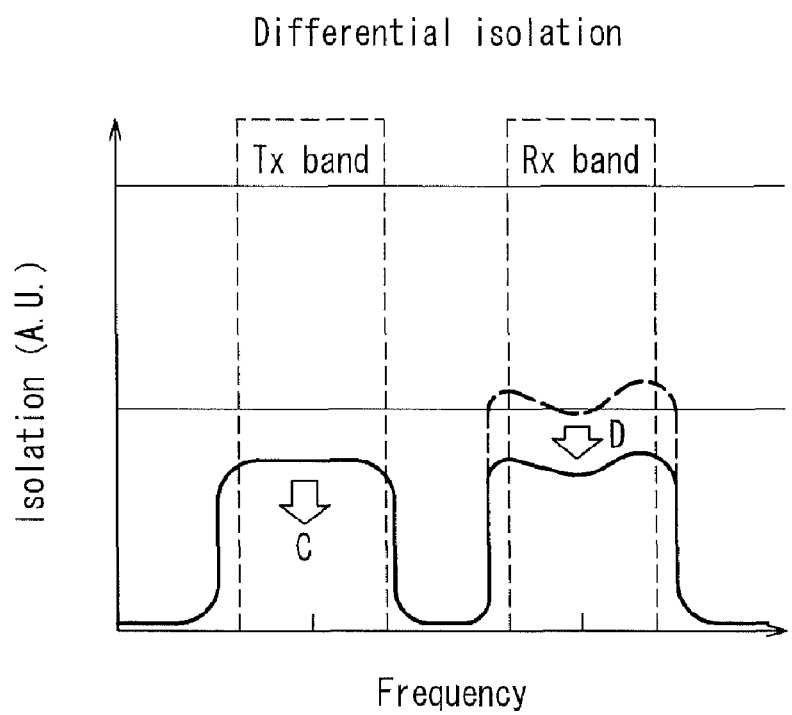
FIG. 8C is a graph showing an example of DI of the duplexer.

One of major characteristics of the present embodiment is to control currents that flow into the two receiving ports from the transmitting port such that the currents become close to in-phase (the phase difference is close to 0°) in the Rx band as shown in FIG. 7. FIG. 8A shows SEI from the transmitting port 3 to the receiving port 4a. FIG. 8B shows SEI from the transmitting port 3 to the receiving port 4b. FIG. 8C shows differential isolation (DI), which is obtained by synthesizing the isolations of the two paths with a balun. FIGS. 8A to 8C each show ideal characteristics. By adjusting currents to be in-phase in the Rx band, the level of DI (FIG. 8C) can be improved more so than that of SEI (FIGS. 8A, 8B) as shown in FIG. 7 even if the transmitting port and the two receiving ports are electromagnetically coupled spatially. That is, it is possible to improve the isolation in the Rx band as indicated by the arrow D in FIG. 8C as well as the isolation in the Tx band as indicated by the arrow C.

At this time, the phases in the Rx band may include at least one of 0° or 360° as perfect in-phase achieved by the principles of common-mode rejection by a balun, 0 to 90° as a range shifted from 0° by ¼ wavelength or 270 to 360° as a range shifted from 360° by ¼ wavelength.

EXAMPLE 1

Figure 9:
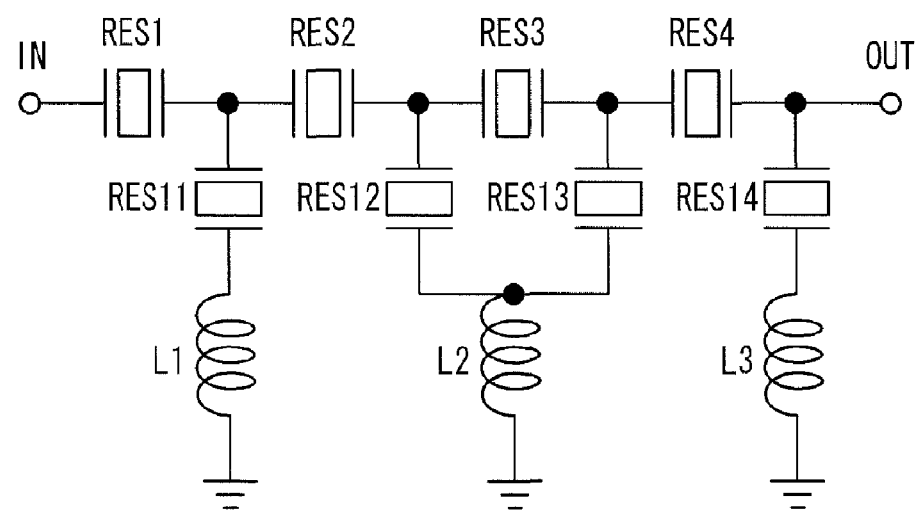
FIG. 9 is a circuit diagram of an example of a ladder filer.

FIG. 9 is a circuit diagram of a transmitting filter included in the duplexer according to the present embodiment. The transmitting filter shown in FIG. 9 includes serial resonators RES1 to RES4, parallel resonators RES11 to RES14, and inductors L1 to L3 (given that the Q value is "10"). The serial resonators RES1 to RES4 are connected to serial arms. The parallel resonator RES11 is connected to a parallel arm connected to a node between the serial resonators RES1 and RES2. The parallel resonator RES12 is connected to a parallel arm connected to a node between the serial resonators RES2 and RES3. The parallel resonator RES13 is connected to a parallel arm connected to a node between the serial resonators RES3 and RES4. The parallel resonator RES14 is connected to a parallel arm connected to a node between the serial resonator RES4 and an output terminal OUT. The inductor L1 is connected to the parallel resonator RES11. The inductor L2 is connected to the parallel resonators RES12 and RES13. The inductor L3 is connected to the parallel resonator RES14. Surface acoustic wave resonators (SAW resonators) or film bulk acoustic resonators (FBARs) can be used to achieve the serial resonators RES1 to RES4 and the parallel resonators RES11 to RES14.

Figure 10:
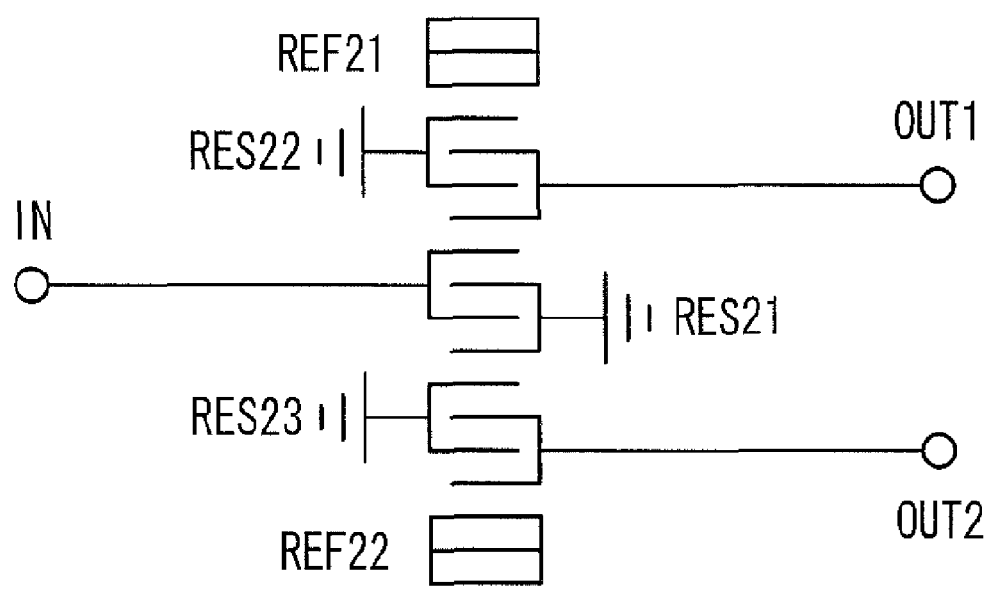
FIG. 10 is a circuit diagram of an example of a double-mode filter.

FIG. 10 is a circuit diagram of a receiving filter included in the duplexer according to the present embodiment. The receiving filter shown in FIG. 10 is an unbalanced input-balanced output double mode SAW (DMS) filter. The receiving filter shown in FIG. 10 includes an input resonator RES21 connected to an input terminal IN, an output resonator RES22 connected to an output terminal OUT1, an output resonator RES23 connected to an output terminal OUT2, and reflectors REF21 and REF22. The input resonator RES21 is excited based on electric signals inputted to the input terminal IN, and oscillations of the input resonator RES21 propagate toward the output resonators RES22 and RES23, thereby oscillating the output resonators RES22 and RES23. As a result, electric signals are outputted from the output terminals OUT1 and OUT2.

Figure 11A:
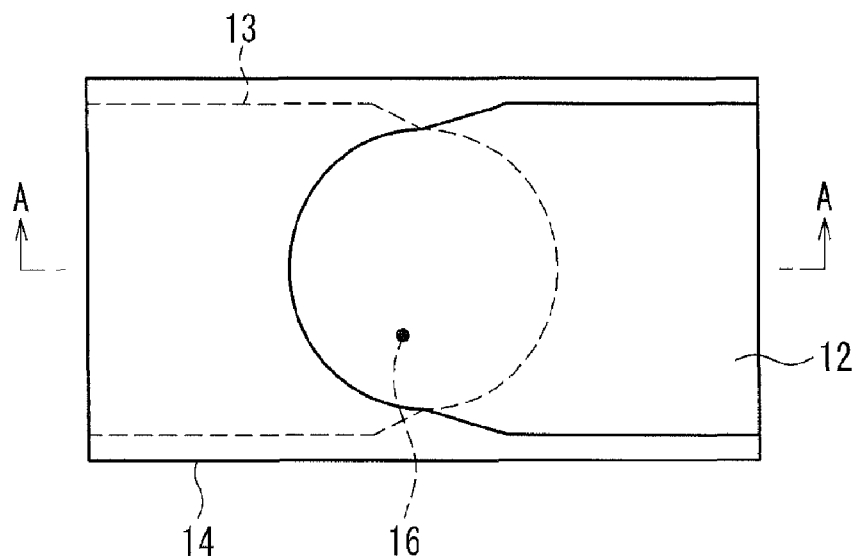
FIG. 11A is a plan view of an example of a film bulk acoustic resonator.
Figure 11B:
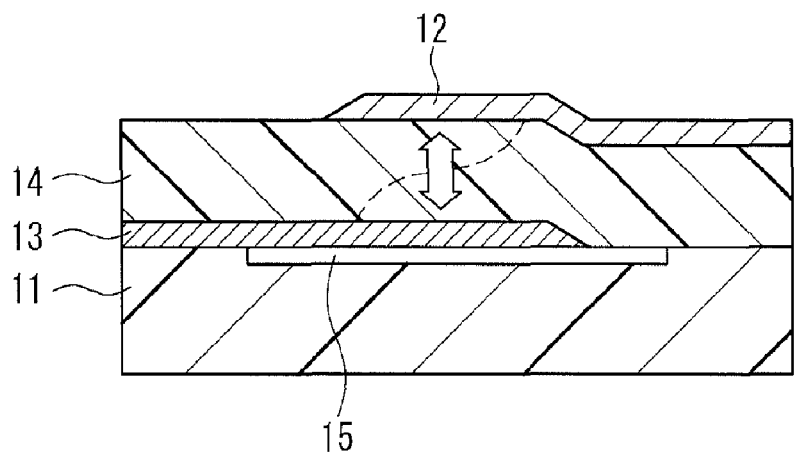
FIG. 11B is a cross-sectional view of the A-A portion in FIG. 11A.

For example, film bulk acoustic resonators as shown in FIGS. 11A and 11B can be used to achieve the resonators. FIG. 11A is a plan view of a film bulk acoustic resonator. FIG. 11B is a cross-sectional view of the A-A portion in FIG. 11A. The film bulk acoustic resonator includes a substrate 11, an upper electrode 12, a lower electrode 13, and a piezoelectric film 14. The upper electrode 12, the lower electrode 13, and the piezoelectric film 14 are laminated on the substrate 11. The substrate 11 includes a cavity 15 at a portion overlapping an area (membrane area) 16 in which at least the upper electrode 12 and the lower electrode 13 oppose each other. As a result of this, the piezoelectric film 14 can oscillate.

Figure 12A:
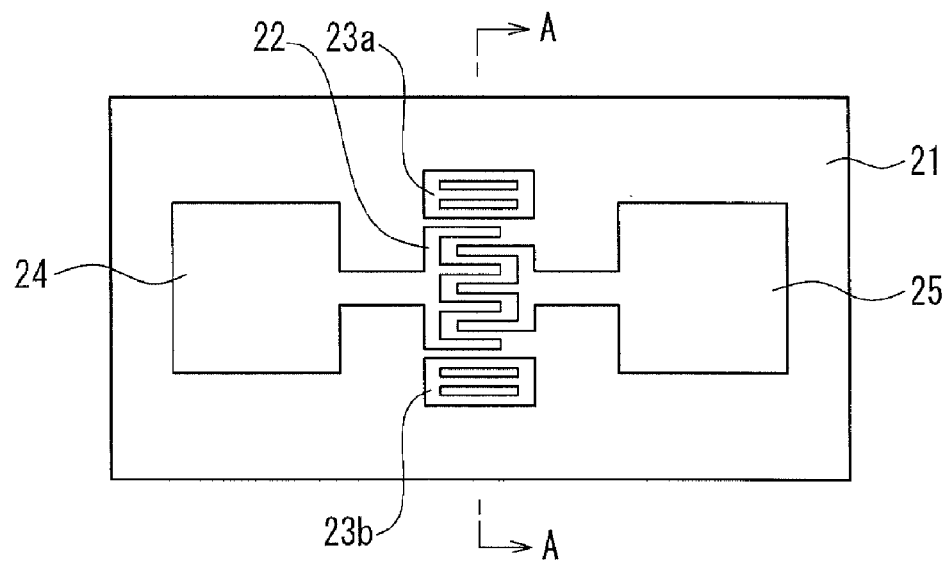
FIG. 12A is a plan view of an example of an acoustic wave resonator.
Figure 12B:
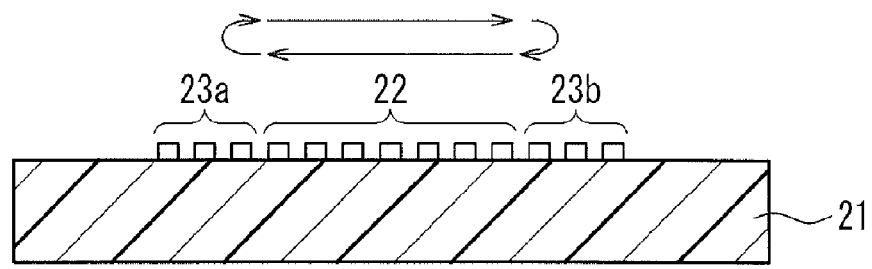
FIG. 12B is a cross-sectional view of the A-A portion in FIG. 12A.

For example, acoustic wave resonators as shown in FIG. 12A and 12B can be used to achieve the resonators. FIG. 12A is a plan view of an acoustic wave resonator. FIG. 12B is a cross-sectional view of the A-A portion in FIG. 12A. The acoustic wave resonator includes a substrate 21, a pair of comb electrodes 22 (Interdigital Transducer IDT), reflectors 23a and 23b, an input terminal 24 and an output terminal 25. The input terminal 24 is connected to one of the comb electrodes 22. The output terminal 25 is connected to the other of the comb electrodes 22. One of the comb electrodes 22 is excited based on electric signals inputted to the input terminal 24. Oscillations of one of the comb electrodes 22 propagate to the other of the comb electrodes 22, and electric signals are outputted to the output terminal 25.

Note that the resonators are not limited to film bulk acoustic resonators and acoustic wave resonators, and other resonators such as acoustic boundary wave resonators may be used to achieve the resonators.

Figure 13:
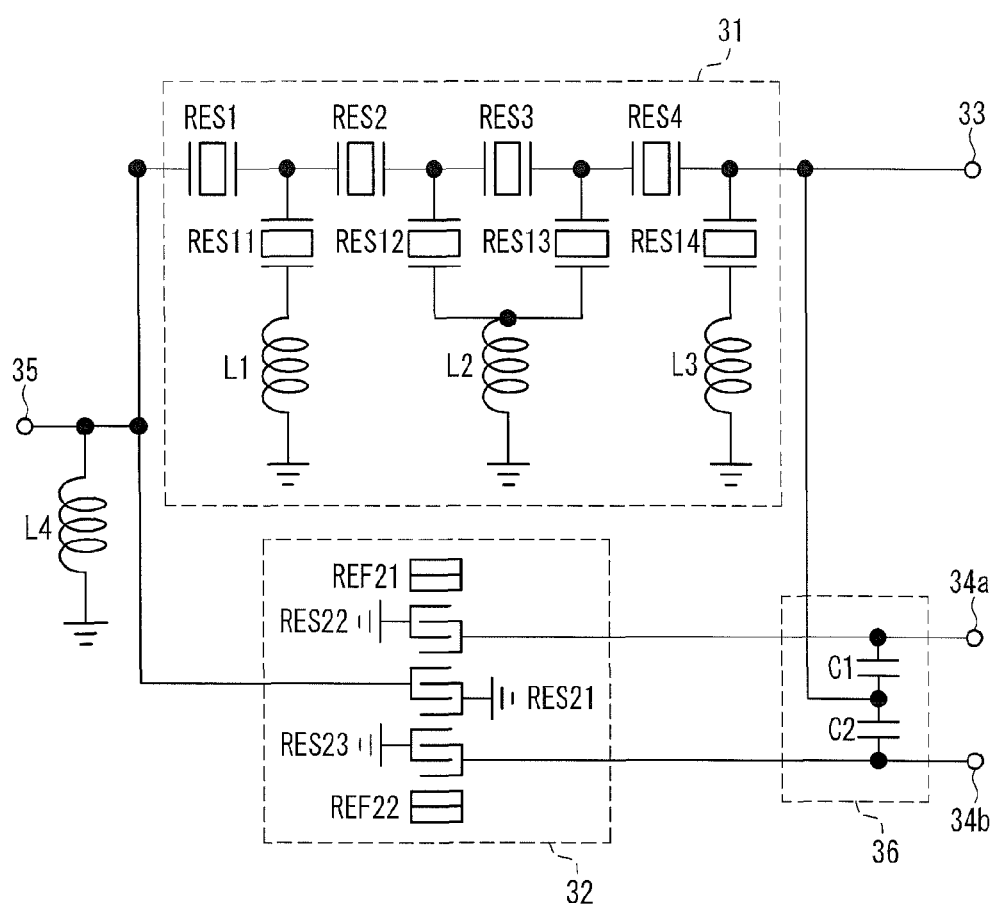
FIG. 13 is a circuit diagram showing an example of a specific configuration of the duplexer.
Figure 14A:
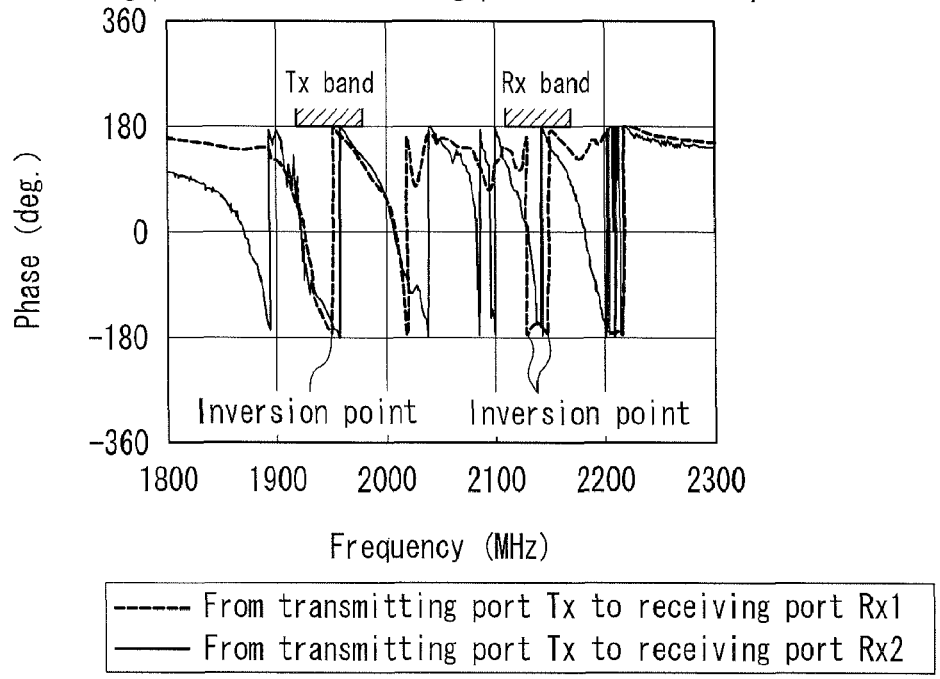
FIG. 14A is a graph showing an example of electric power transmission characteristics of the paths from the transmitting port to the two receiving ports in terms of phase.
Figure 14B:
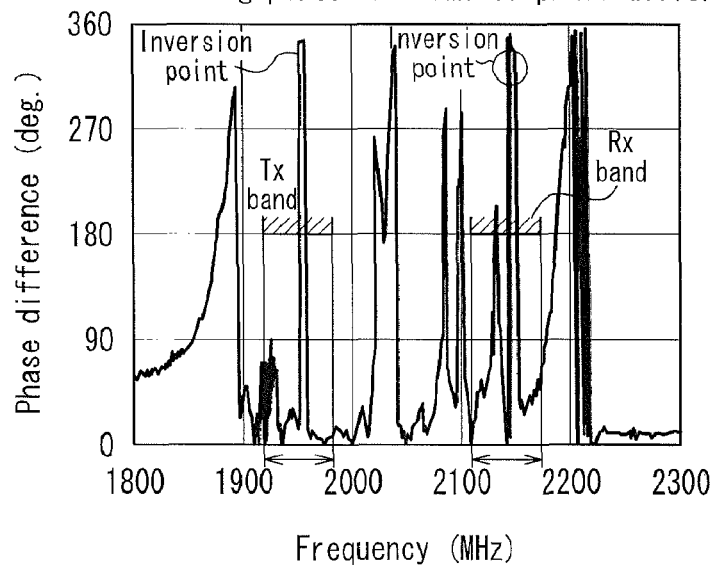
FIG. 14B is a graph showing an example of electric power transmission characteristics of the paths from the transmitting port to the two receiving ports in terms of phase difference.

FIG. 13 is a circuit diagram of the duplexer according to the present embodiment. The duplexer shown in FIG. 13 includes a transmitting filter 31, a receiving filter 32, a transmitting port 33, receiving ports 34a and 34b, an antenna port 35, and an electrostatic coupling portion 36. A ladder filter having the same configuration as that shown in FIG. 9 is used as the transmitting filter 31. A DMS filter having the same configuration as that shown in FIG. 10 is used as the receiving filter 32. The electrostatic coupling portion 36 includes capacities C1 and C2. The capacities C1 and C2 are connected to each other in series, and they are connected between the receiving ports 34a and 34b. A node between the capacities C1 and C2 is connected to the transmitting port 33. The capacities C1 and C2 each are configured to have such a constant that electric power transmission characteristics of the path from the transmitting port 33 to the receiving port 34a and those of the path from the transmitting port 33 to the receiving port the 34b have a phase difference of 0 to 90° in the Rx band except at a phase inversion point as shown in FIGS. 14A and 14B. As an example, each constant in the present embodiment is set such that the phase difference becomes about 40° as shown in the Rx band in FIG. 14B. FIG. 14A shows electric power transmission characteristics of the paths from the transmitting port 33 to the receiving port 34a and 34b in terms of phase. FIG. 14B shows electric power transmission characteristics of the paths from the transmitting port 33 to the receiving ports 34a and 34b in terms of phase difference.

Figure 15A:
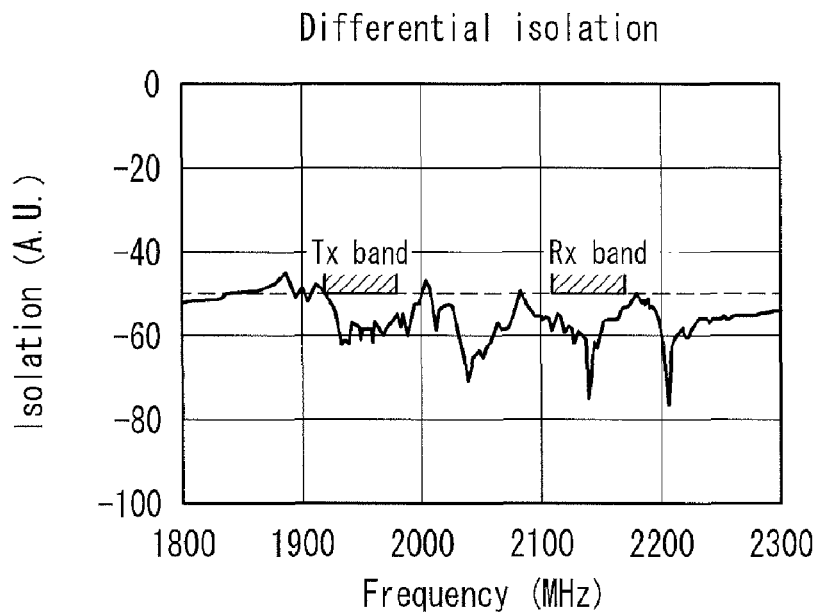
FIG. 15A is a graph showing an example of DI of the duplexer.
Figure 15B:
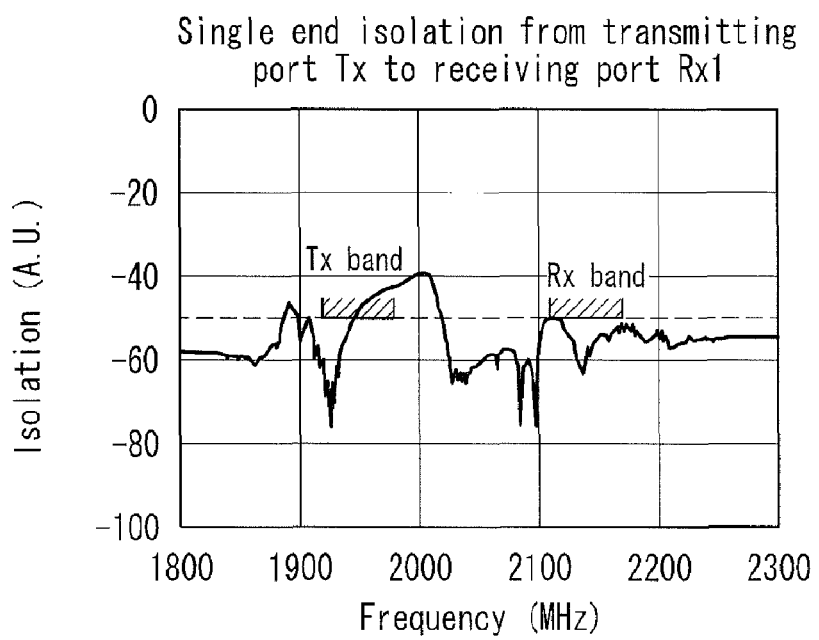
FIG. 15B is a graph showing an example of SEI from the transmitting port to the receiving port.
Figure 15C:
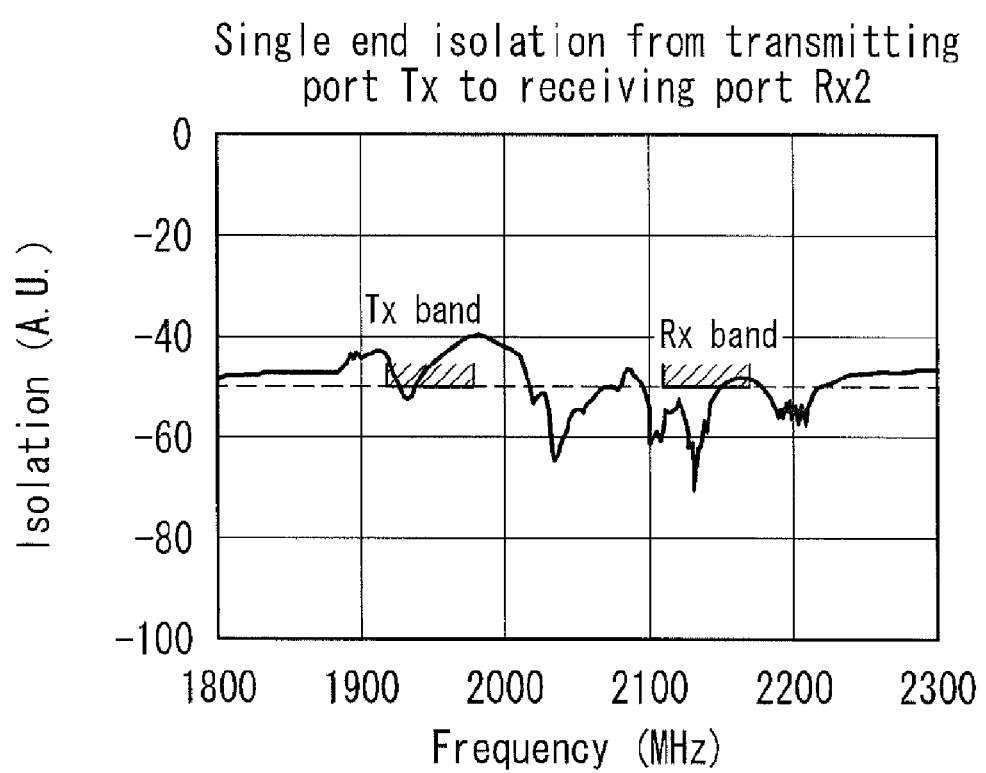
FIG. 15C is a graph showing an example of SEI from the transmitting port to the receiving port.

By configuring the duplexer in this way, DI can have characteristics as shown in FIG. 15A and SEI can have characteristics as shown in FIGS. 15B and 15C. FIG. 15A shows DI of the duplexer shown in FIG. 13. FIG. 15B shows SEI from the transmitting port 33 to the receiving port 34a shown in FIG. 13. FIG. 15C shows SEI from the transmitting port 33 to the receiving port 34b shown in FIG. 13. A comparison between FIG. 15A and FIGS. 15B and 15C shows that DI is at a lower level than SEI in the Rx band.

Figure 16:
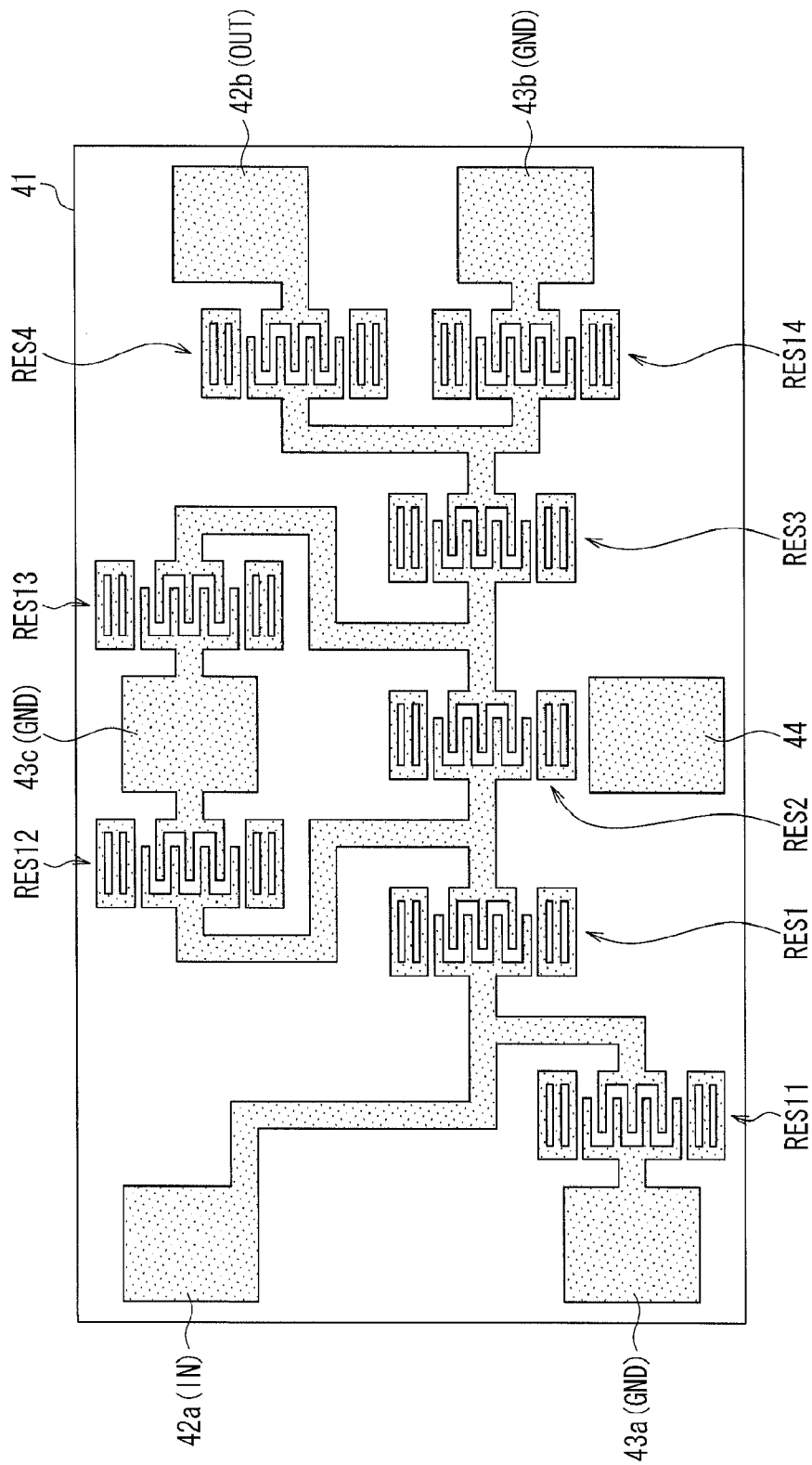
FIG. 16 is a schematic diagram showing an example of a specific configuration of a ladder filter.

FIG. 16 shows a specific example of the transmitting filter 31 included in the duplexer shown in FIG. 13. The transmitting filter shown in FIG. 16 includes, on a substrate 41, signal terminals 42a and 42b, ground terminals 43a, 43b, and 43c, a dummy pattern 44, serial resonators RES1 to RES4, and parallel resonators RES11 to RES14. For convenience of explanation, the same reference numerals as those in FIG. 9 are used to denote the serial resonators and the parallel resonators.

Figure 17:
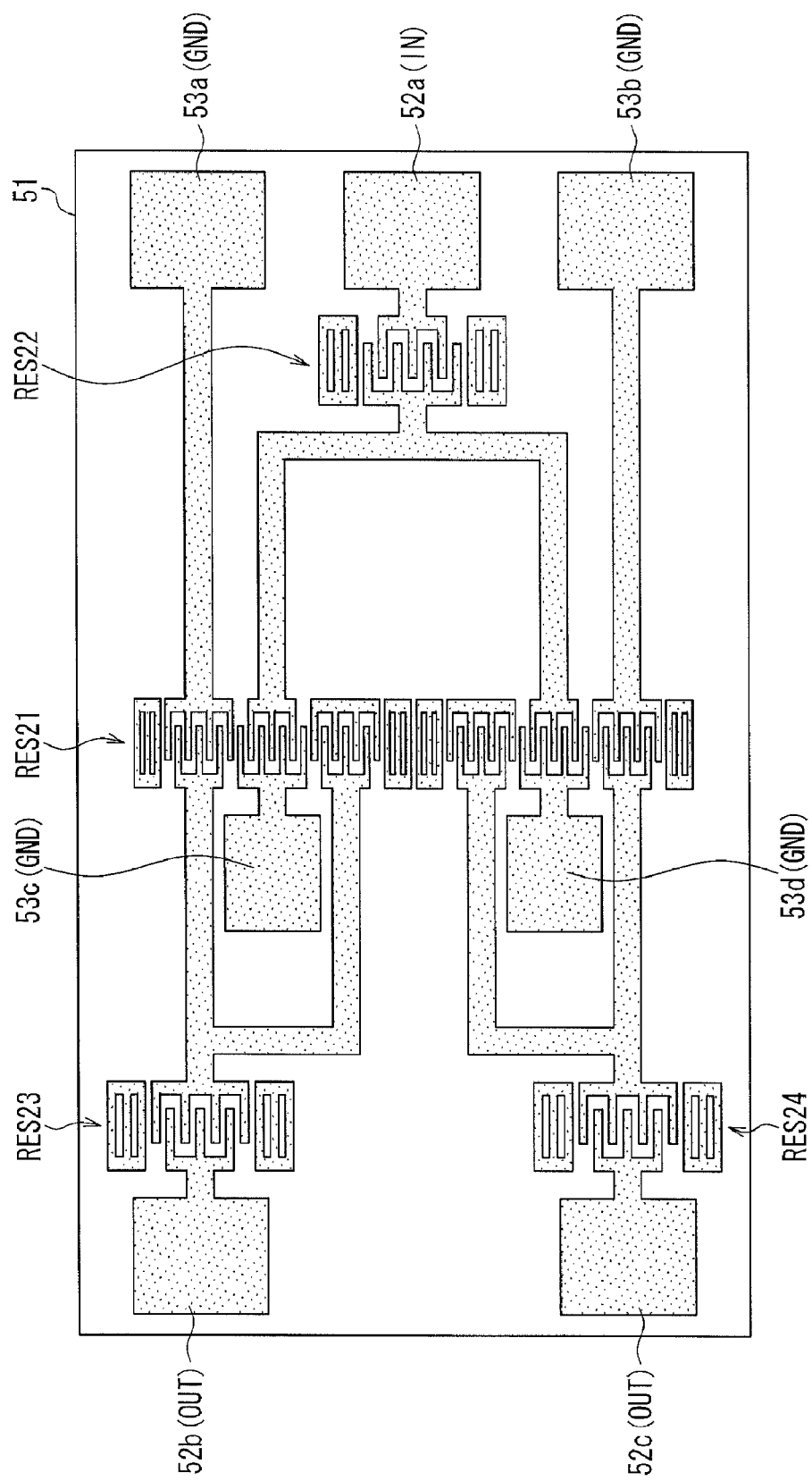
FIG. 17 is a schematic diagram showing an example of a specific configuration of a double-mode filter.

FIG. 17 shows a specific example of the receiving filter 32 included in the duplexer shown in FIG. 13. The receiving filter shown in FIG. 17 includes, on a substrate 51, signal terminals 52a, 52b, and 52c, ground terminals 53a, 53b, and 53c, and resonators RES21, RES22, and RES23. The signal terminal 52a is a terminal for receiving electric signals, and the signal terminals 52b and 52c are terminals for outputting electric signals.

Figure 18A:
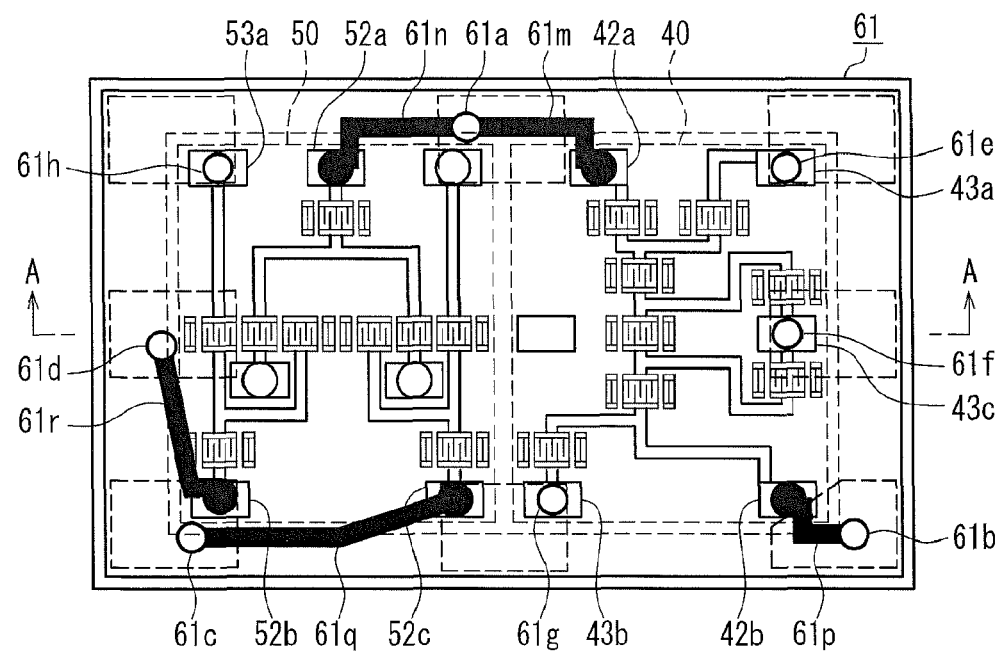
FIG. 18A is a schematic diagram showing an example of a specific configuration of the upper layer of a duplexer.
Figure 18B:
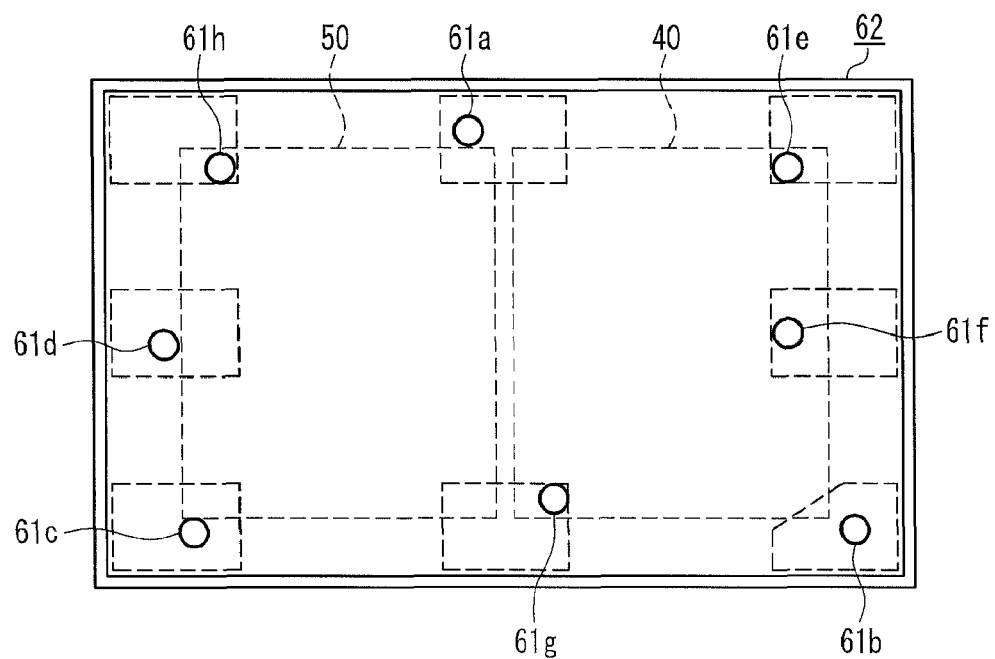
FIG. 18B is a schematic diagram showing an example of a specific configuration of the internal layer of the duplexer.
Figure 18C:
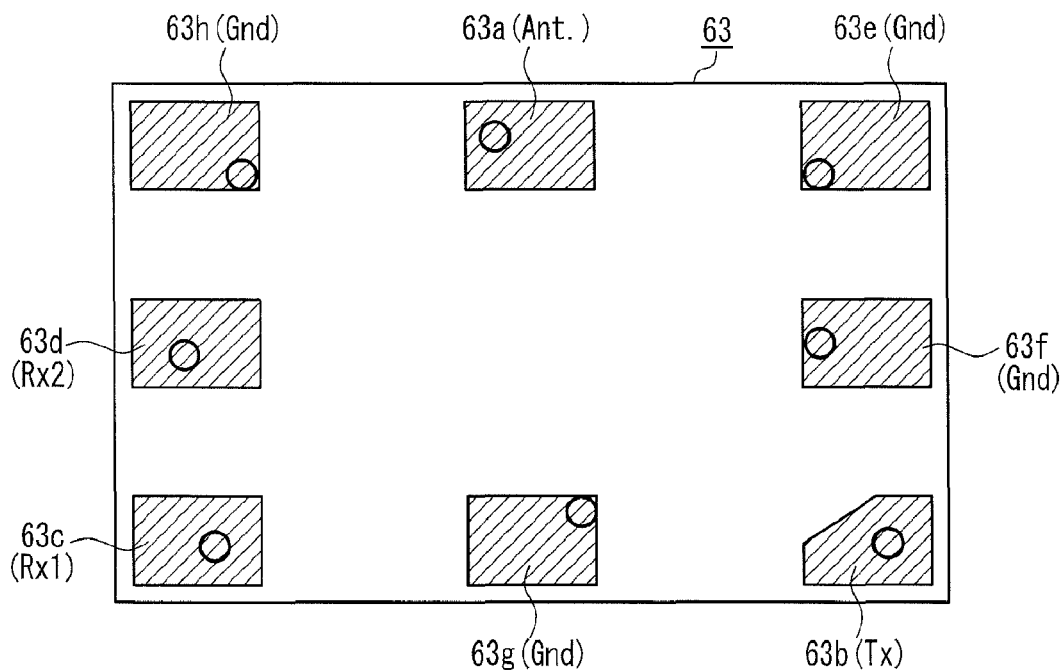
FIG. 18C is a schematic diagram showing an example of a specific configuration of the lower layer of the duplexer.
Figure 18D:
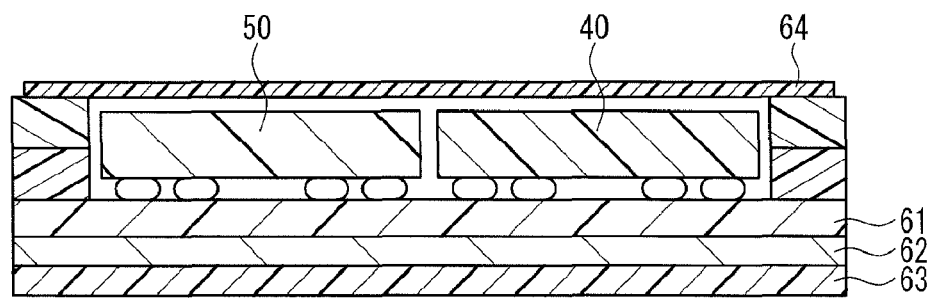
FIG. 18D is a cross-sectional view of the duplexer shown in FIG. 18A.

FIGS. 18A to 18D show a specific example of the duplexer. As shown in FIGS. 18A to 18D, the duplexer may have a form in which the transmitting filter and the receiving filter as described above are mounted face down on a multilayer ceramics substrate through the use of bumps. Specifically, FIG. 18A is a plan view showing the configuration of the upper layer of the ceramics substrate, FIG. 18B is a plan view showing the configuration of the internal layer of the ceramics substrate, and FIG. 18C is a plan view showing the configuration of the backside of the ceramics substrate. FIG. 18D is a cross-sectional view of the A-A portion in FIG. 18A.

As shown in FIG. 18A, the transmitting filter 40 and the receiving filter 50 are patterned on the upper layer 61. Of the transmitting filter 40, the same components as those shown in FIG. 16 are denoted by the same reference numerals. Of the receiving filter 50, the same components as those shown in FIG. 17 are denoted by the same reference numerals. A signal terminal 42a of the transmitting filter 40 is connected to a through hole 61a via a signal line 61m. A signal terminal 42b of the transmitting filter 40 is connected to a through hole 61b via a signal line 61p. A ground terminal 43a of the transmitting filter 40 is connected to a through hole 61e. A ground terminal 43a of the transmitting filter 40 is connected to a through hole 61g. A ground terminal 43c of the transmitting filter 40 is connected to a through hole 61f. A signal terminal 52a of the receiving filter 50 is connected to the through hole 61a via a signal line 61n. A signal terminal 52b of the receiving filter 50 is connected to a through hole 61d via a signal line 61r. A signal terminal 52c of the receiving filter 50 is connected to a through hole 61c via a signal line 61q. A ground terminal 53a of the receiving filter 50 is connected to a through hole 61h. The through hole 61a is connected to an antenna terminal 63a on a lower layer 63 shown in FIG. 18C through the internal layer 62 shown in FIG. 18B. The through hole 61b is connected to a transmitting port 63b on the lower layer 63 shown in FIG. 18C through the internal layer 62 shown in FIG. 18B. The through hole 61c is connected to a receiving port 63c on the lower layer 63 shown in FIG. 18C through the internal layer 62 shown in FIG. 18B. The through hole 61d is connected to a receiving port 63d on the lower layer 63 shown in FIG. 18C through the internal layer 62 shown in FIG. 18B. The through hole 61e is connected to a ground terminal 63e on the lower layer 63 shown in FIG. 18C through the internal layer 62 shown in FIG. 18B. The through hole 61f is connected to the ground terminal 63f on the lower layer 63 shown in FIG. 18C through the internal layer 62 shown in FIG. 18B. The through hole 61g is connected to a ground terminal 63g on the lower layer 63 shown in FIG. 18C through the internal layer 62 shown in FIG. 18B. The through hole 61h is connected to a ground terminal 63h on the lower layer 63 shown in FIG. 18C through the internal layer 62 shown in FIG. 18B.

EXAMPLE 2

Figure 19:
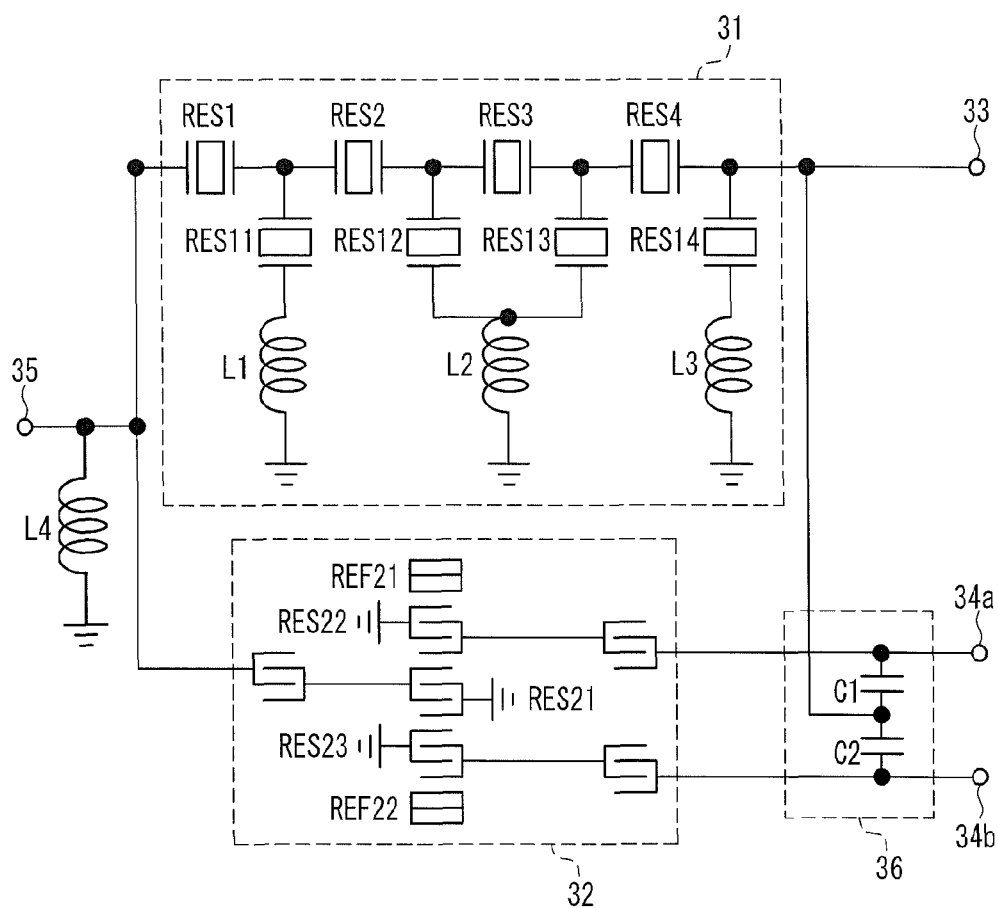
FIG. 19 is a circuit diagram showing an example of a specific circuit configuration of a duplexer.
Figure 20A:
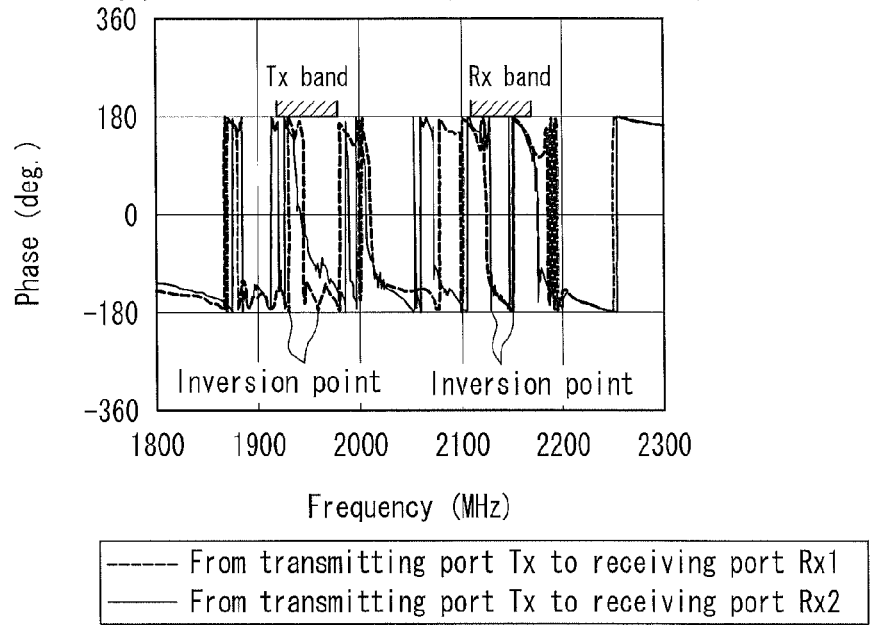
FIG. 20A is a graph showing an example of electric power transmission characteristics of the paths from the transmitting port to the two receiving ports in terms of phase.
Figure 20B:
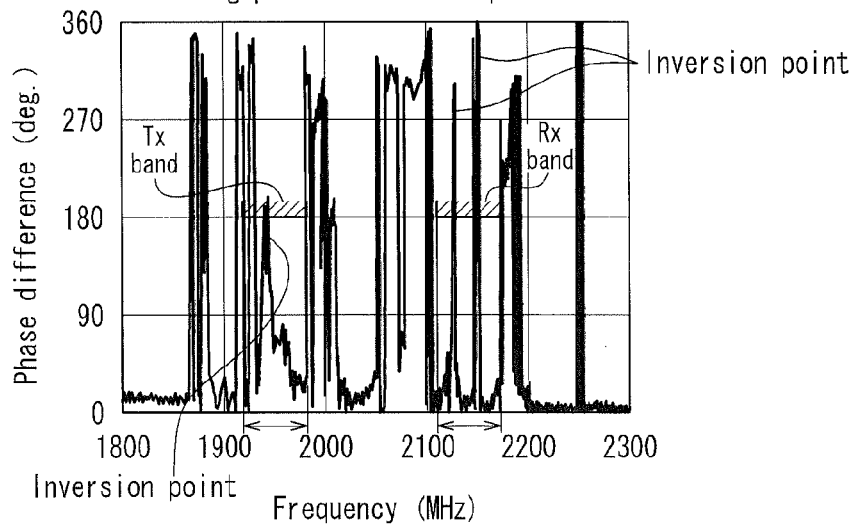
FIG. 20B is a graph showing an example of electric power transmission characteristics of the paths from the transmitting port to the two receiving ports in terms of phase difference.

FIG. 19 is a circuit diagram showing the configuration of a duplexer of Example 2 according to the present embodiment. Since the basic components shown in FIG. 19 can be the same as those in FIG. 13, the description thereof will not be repeated. The capacities C1 and C2 have equal constants. In the present embodiment, the capacities C1 and C2 each have a constant of, for example, 5 pF. The term "equal constants" as used herein means that not only the capacities C1 and C2 have completely the same constant but also have constants different in some degree due to production variation or the like, so that their constants are not limited to completely coinciding constants. In this way, when the capacities C1 and C2 are configured to have equal constants, electric power transmission characteristics of the paths from the transmitting port to the two receiving ports have a phase difference of about 10 to 20° in the Rx band except at a phase inversion point as shown in FIGS. 20A and 20B. Thus, the phase relation more idealistic than the phase relation shown in FIG. 14B can be achieved. FIG. 20A shows electric power transmission characteristics of the paths from the transmitting port 33 to the receiving ports 34a and 34b in terms of phase. FIG. 20B shows electric power transmission characteristics of the paths from the transmitting port 33 to the receiving ports 34a and 34b in terms of phase difference.

Figure 21A:
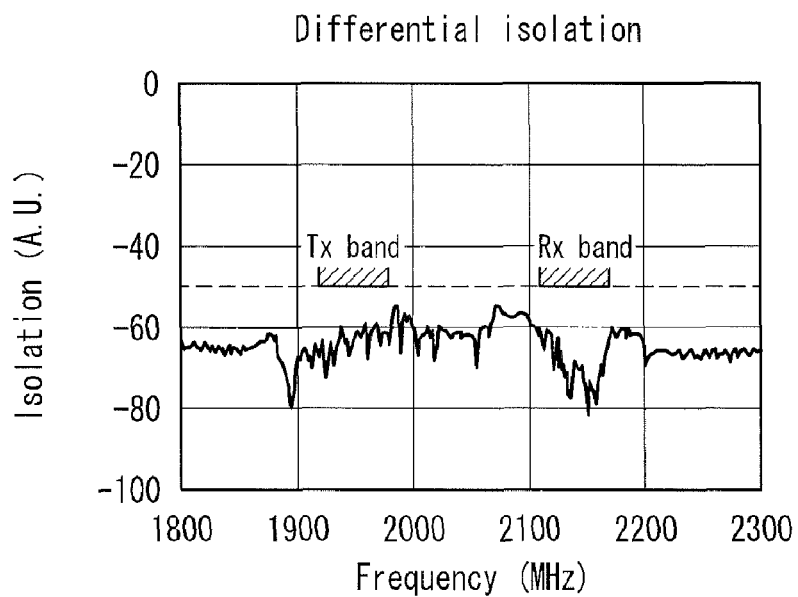
FIG. 21A is a graph showing an example of DI of the duplexer.
Figure 21B:
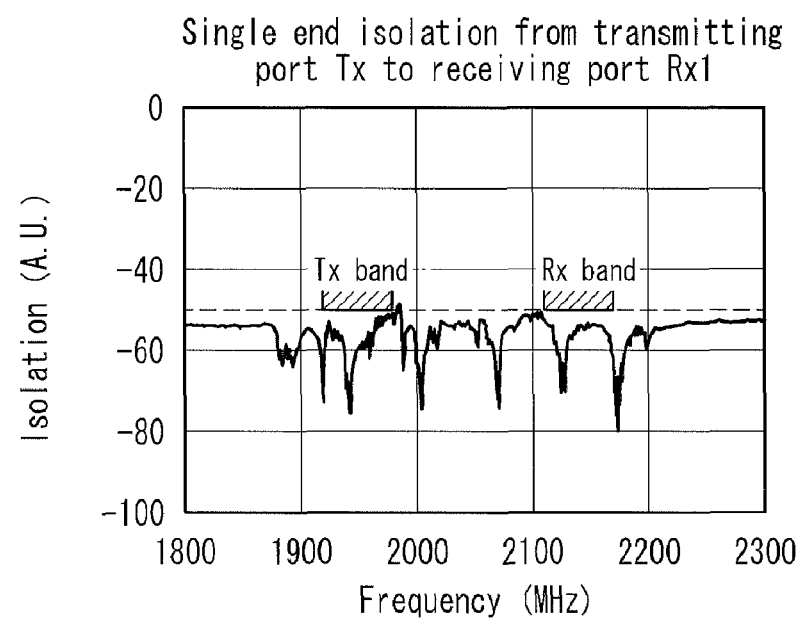
FIG. 21B is a graph showing an example of SEI from the transmitting port to the receiving port.
Figure 21C:
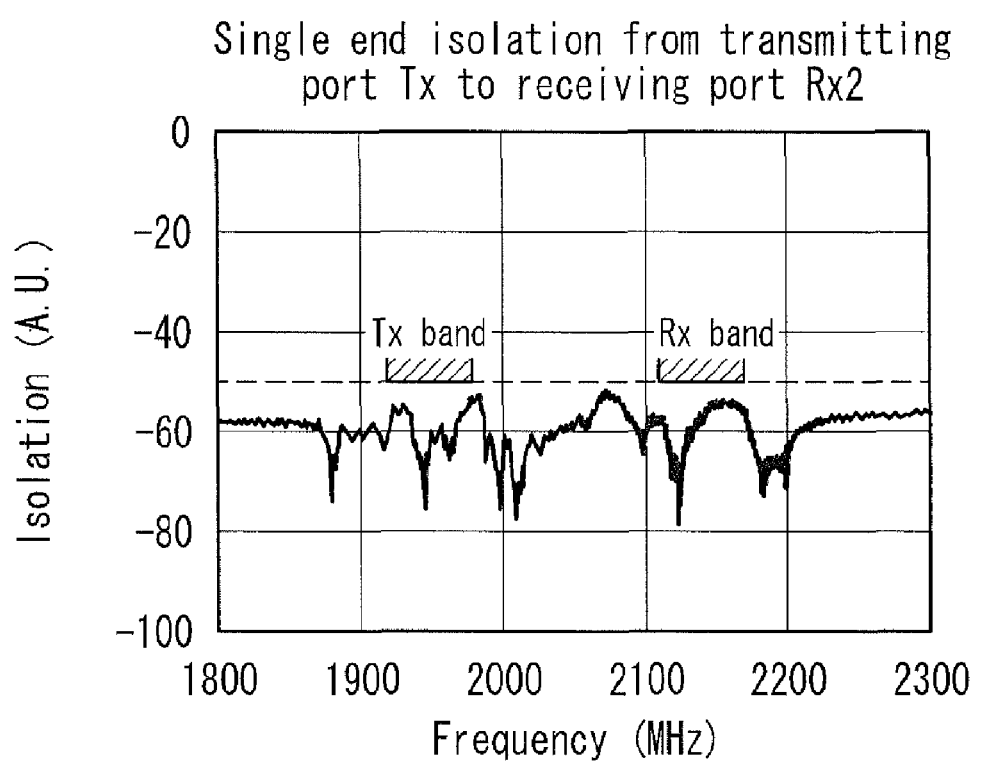
FIG. 21C is a graph showing an example of SEI from the transmitting port to the receiving port.

By configuring the duplexer in this way, DI will have characteristics as shown in FIG. 21A and SEI will have characteristics as shown in FIGS. 21B and 21C. FIG. 21A shows DI of the duplexer shown in FIG. 19. FIG. 21B shows SEI from the transmitting port 33 to the receiving port 34*a* shown in FIG. 19. FIG. 21C shows SEI from the transmitting port 33 to the receiving port 34*b* shown in FIG. 19. A comparison between FIG. 21A and FIGS. 21B and 21C shows that DI is at a lower level than SEI in the Rx band.

EXAMPLE 3

Figure 22:
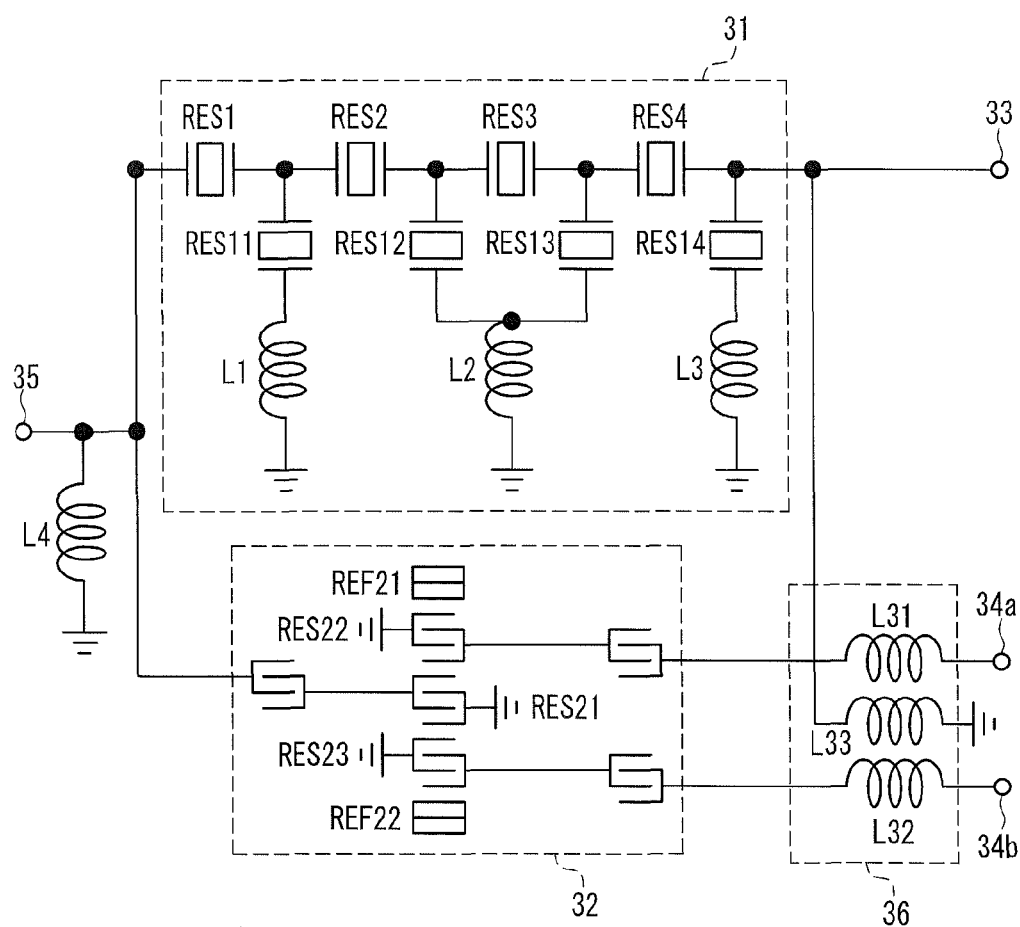
FIG. 22 is a circuit diagram showing an example of a specific configuration of a duplexer.

FIG. 22 is a circuit diagram showing the configuration of a duplexer of Example 3 according to the present embodiment. The duplexer shown in FIG. 22 includes a transmitting filter 31, a receiving filter 32, a transmitting port 33, receiving ports 34*a* and 34*b*, an antenna port 35 and an electromagnetic coupling portion 36. A ladder filter having the same configuration as that shown in FIG. 9 can be used as the transmitting filter 31. A DMS filter having the same configuration as that shown in FIG. 10 can be used as the receiving filter 32. The electromagnetic coupling portion 36 includes inductors L31, L32, and L33. The inductor L31 is connected between the receiving filter 32 and the receiving port 34*a*. The inductor L32 is connected between the receiving filter 32 and the receiving port 34*b*. The inductor L33 is connected between the transmitting port 33 and the ground. The inductors L31 and L32 are disposed adjacent to each other and are electromagnetically coupled to develop a capacity in the space therebetween. The inductors L32 and L33 are disposed adjacent to each other and are electromagnetically coupled to develop a capacity in the space therebetween. The electromagnetic coupling portion 36 is configured to have such a constant that the paths from the transmitting port 33 to the two receiving ports 34*a* and 34*b* have a phase difference of roughly 0 to 90° in the Rx band. By configuring the duplexer in this way, DI can be at a lower level than SEI in the Rx band.

EXAMPLE 4

FIGS. 23A to 23D are schematic diagrams showing the specific configuration of the duplexer according to the present embodiment. In FIGS. 23A to 23D, the same components as those shown in FIGS. 18A to 18D are denoted by the same reference numerals, and the description thereof will not be repeated.

Figure 23A:
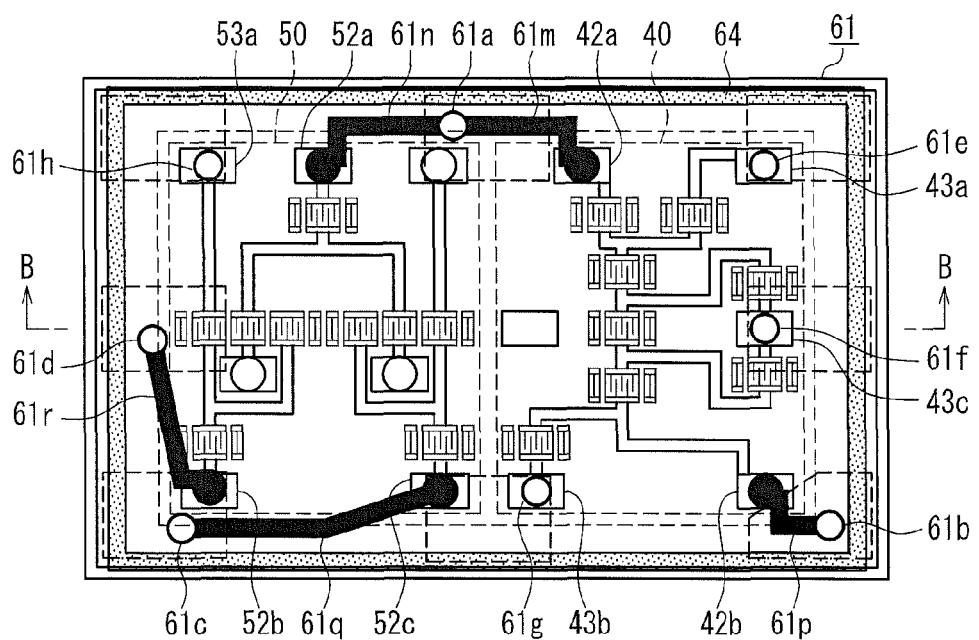
FIG. 23A is a schematic diagram showing an example of a specific configuration of the upper layer of the duplexer.
Figure 23B:
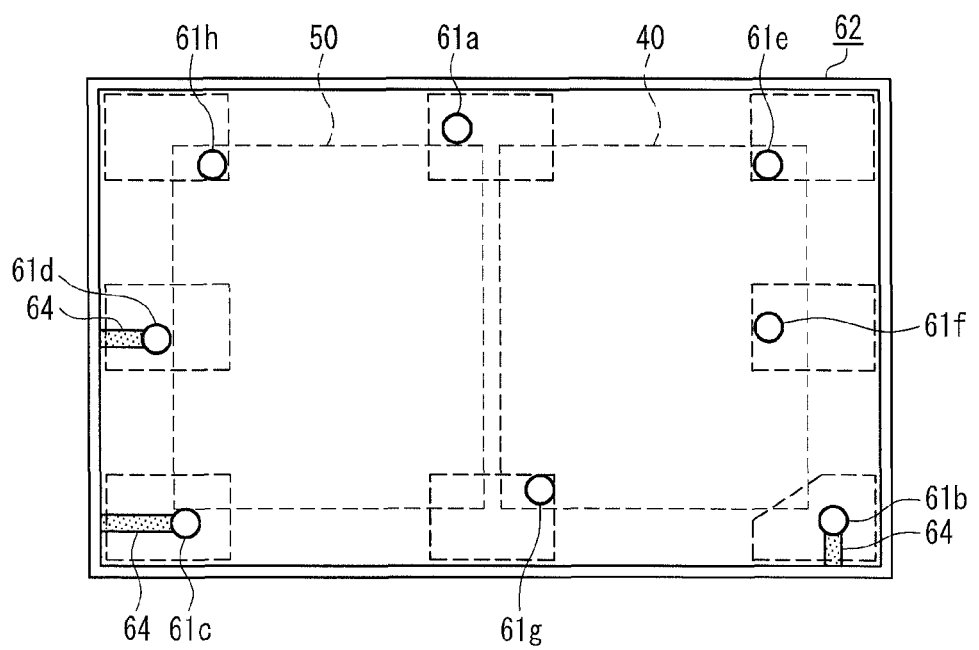
FIG. 23B is a schematic diagram showing an example of a specific configuration of the internal layer of the duplexer.
Figure 23C:
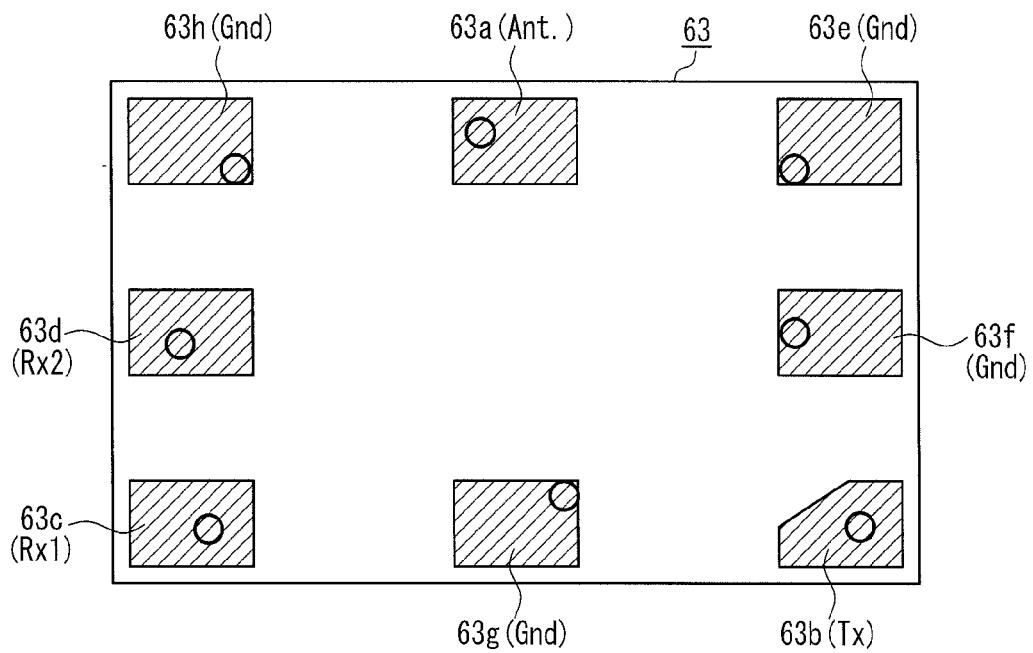
FIG. 23C is a schematic diagram showing an example of a specific configuration of the lower layer of the duplexer.
Figure 23D:
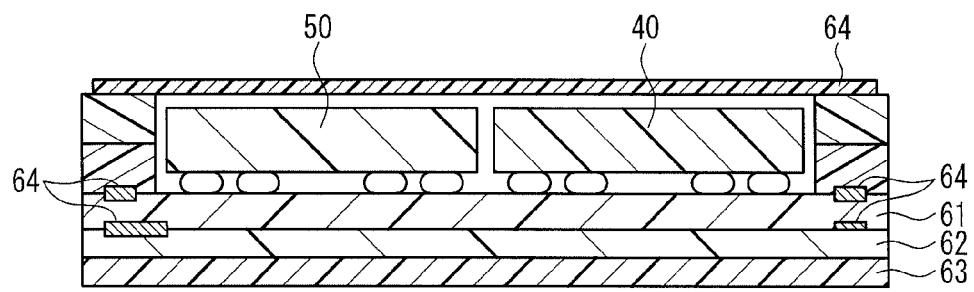
FIG. 23D is a cross-sectional view of the duplexer shown in FIG. 18A.

The duplexer of Example 4 includes a conductor 64. As shown in FIG. 23A, the conductor 64 is disposed along the perimeter of the upper layer 61 of the ceramics substrate in a loop. As shown in FIG. 23B, the conductor 64 is connected to through holes 61*b*, 61*c* and 61*d* in the internal layer 62 of the ceramics substrate. Since the through hole 61*b* is connected to the transmitting port 63*b* shown in FIG. 23C, the through hole 61*c* is connected to the receiving port 63*c* shown in FIG. 23C, and the through hole 61*d* is connected to the receiving port 63*d* shown in FIG. 23C, the transmitting port 33 and the receiving port 34*a* and the transmitting port 33 and the receiving port 34*b* can be electrostatically coupled.

In this way, by simply adding the conductor 64 to the duplexer shown in FIGS. 18A to 18D, it is possible to achieve the duplexer according to the present embodiment shown in FIG. 13 and the like. That is, this duplexer can be achieved without making significant changes to the structure of the duplexer shown in FIGS. 18A to 18D. Thus, the duplexer can be achieved without substantially increasing the size.

Figure 24A:
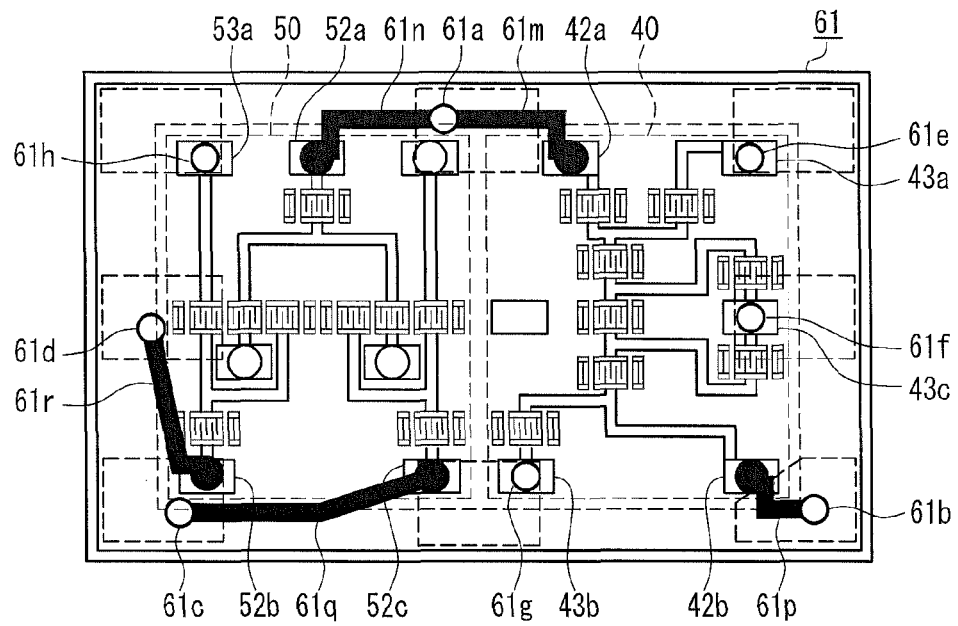
FIG. 24A is a schematic diagram showing an example of a specific configuration of the upper layer of the duplexer.
Figure 24B:
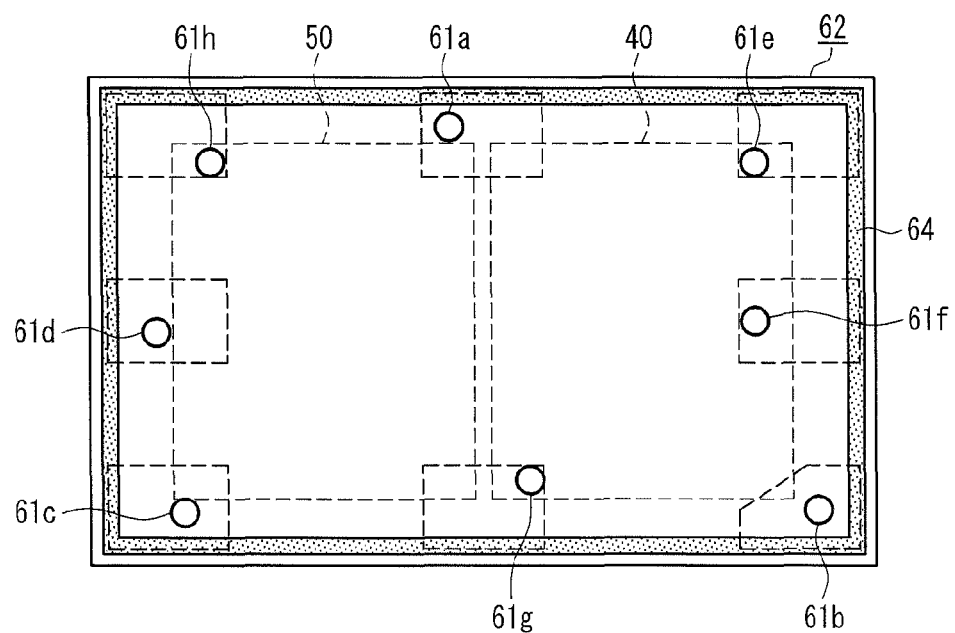
FIG. 24B is a schematic diagram showing an example of a specific configuration of the first internal layer of the duplexer.
Figure 24C:
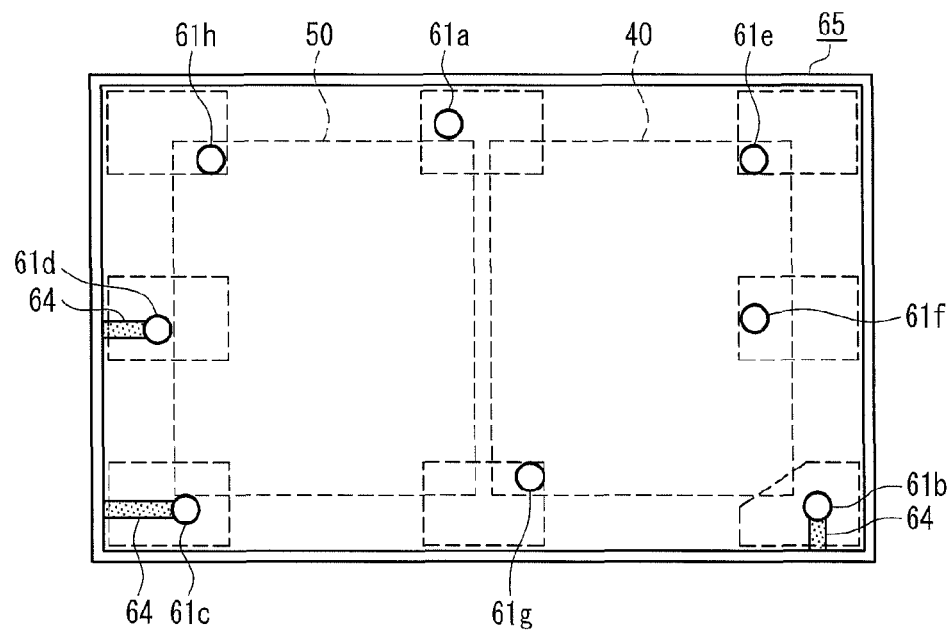
FIG. 24C is a schematic diagram showing an example of a specific configuration of the second internal layer of the duplexer.

In Example 4, the conductor 64 is provided on the upper layer 61 of the ceramics substrate. However, the conductor 64 may be formed on the internal layer as shown in FIGS. 24A to 24D. FIG. 24A is a plan view of the upper layer 61 of the ceramics substrate. FIG. 24B is a plan view of a first internal layer 62. FIG. 24C is a plan view of a second internal layer 65.

Figure 24D:
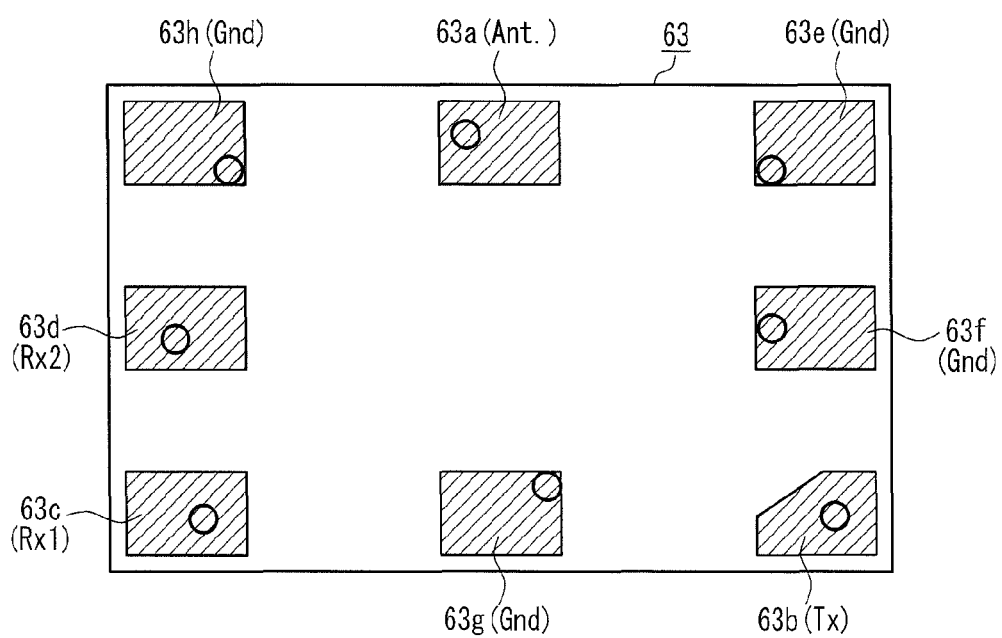
FIG. 24D is a schematic diagram showing an example of a specific configuration of the lower layer of the duplexer.

FIG. 24D is a plan view of the lower layer 63. In the ceramics substrate, the upper layer 61, the first internal layer 62, the second internal layer 65 and the lower layer 63 are laminated in this order. As shown in FIG. 24B, the conductor 64 is disposed close to the perimeter of the first internal layer 62. Further, as shown in FIG. 24C, the conductor 64 is connected to the through holes 61*b*, 61*c* and 61*d*. Since the through hole 61*b* is connected to the transmitting port 63*b* shown in FIG. 24D, the through hole 61*c* is connected to the receiving port 63*c* shown in FIG. 24D, and the through hole 61*d* is connected to the receiving port 63*d* shown in FIG. 24D, the transmitting port 33 and the receiving port 34*a* and the transmitting port 33 and the receiving port 34*b* can be electrostatically coupled.

Further, the conductor 64 may be partially grounded. Further, a part of the conductor 64 may be on a different layer from the layer on which other part is disposed. Further, the conductor 64 may form an additional electrostatic coupling at least one part of the paths from the transmitting port 33 to the receiving ports 34*a* and 34*b*.

Figure 25A:
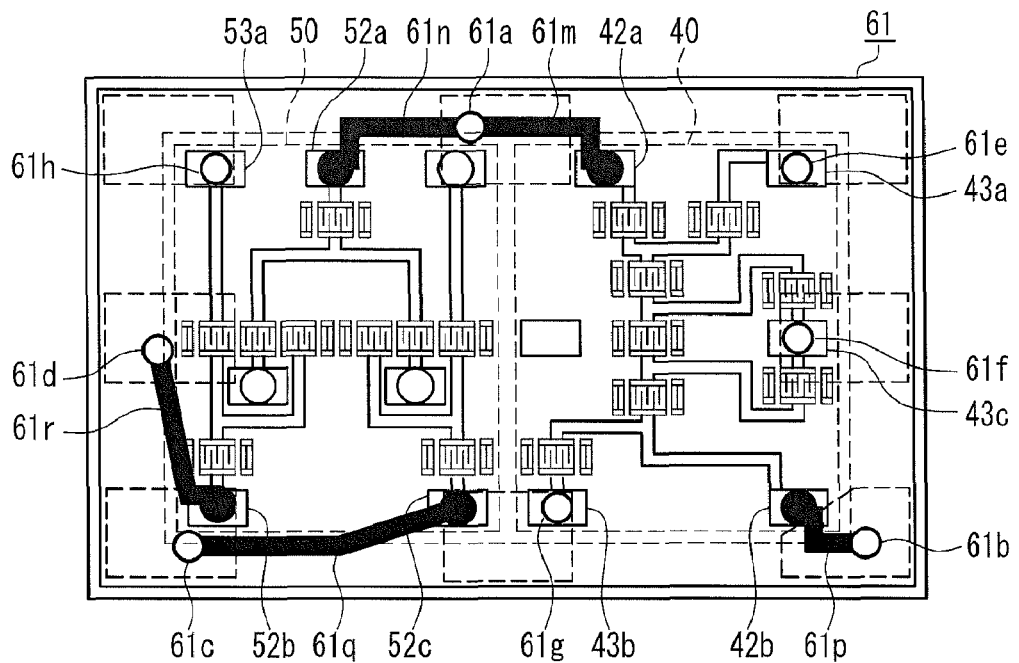
FIG. 25A is a schematic diagram showing an example of a specific configuration of the upper layer of the duplexer.
Figure 25B:
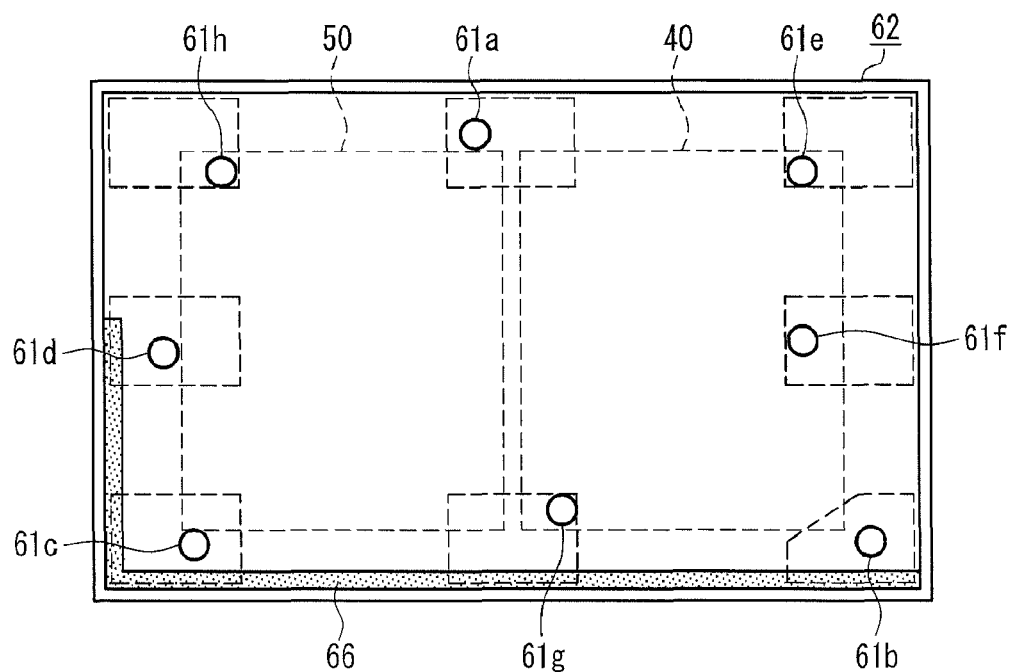
FIG. 25B is a schematic diagram showing an example of a specific configuration of the first internal layer of the duplexer.
Figure 25C:
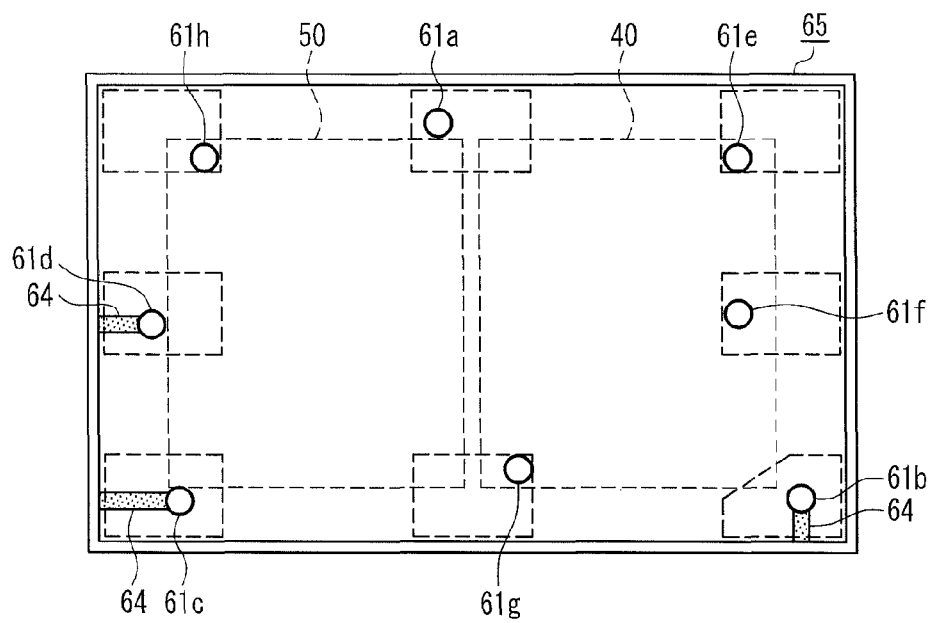
FIG. 25C is a schematic diagram showing an example of a specific configuration of the second internal layer of the duplexer.
Figure 25D:
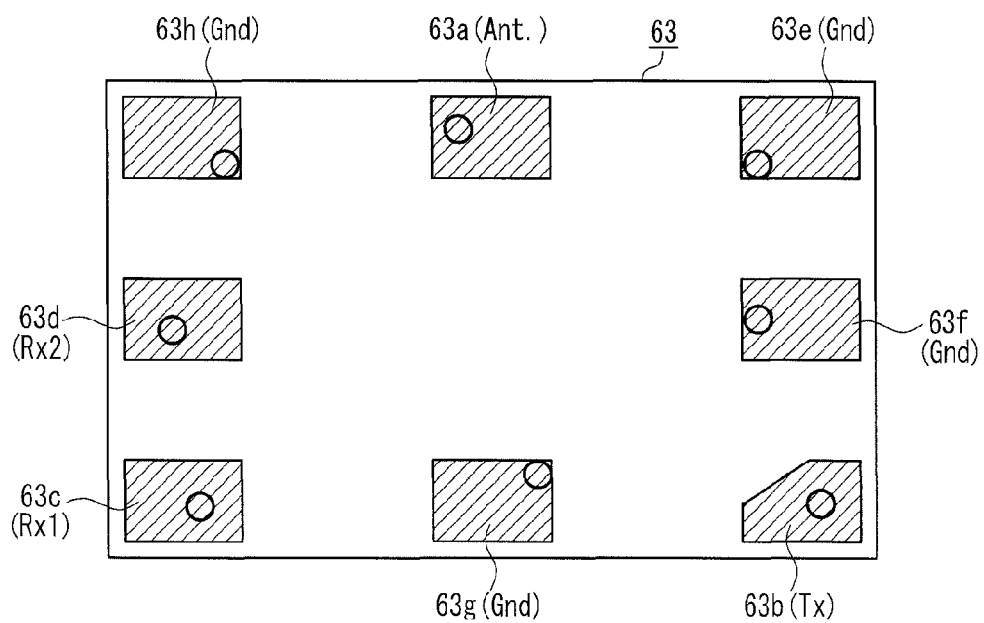
FIG. 25D is a schematic diagram showing an example of a specific configuration of the lower layer of the duplexer.

As long as the transmitting port 33 and the receiving port 34*a* and the transmitting port 33 and the receiving port 34*b* can be electrostatically coupled, the conductor 64 does not need to be in a loop. FIG. 25A is a plan view of the upper layer 61 of the ceramics substrate. FIG. 25B is a plan view of the first internal layer 62. FIG. 25C is a plan view of the second internal layer 65. FIG. 25D is a plan view of the lower layer 63. In the ceramics substrate, the upper layer 61, the first internal layer 62, the second internal layer 65 and the lower layer 63 are laminated in this order. As shown in FIG. 25B, a conductor 66 is disposed substantially in an L shape near a part of the perimeter of the first internal layer 62. As shown in FIG. 25C, the conductor 66 is connected to the through holes 61*b*, 61*c* and 61*d*. The through hole 61*b* is connected to the transmitting port 63*b* shown in FIG. 25D, the through hole 61*c* is connected to the receiving port 63*c* shown in FIG. 25D, and the through hole 61*d* is connected to the receiving port 63*d* shown in FIG. 25D. Thus, the transmitting port 33 and the receiving port 34*a* and the transmitting port 33 and the receiving port 34*b* can be electrostatically coupled.

[2. Configuration Example of Communication Module]

Figure 26:
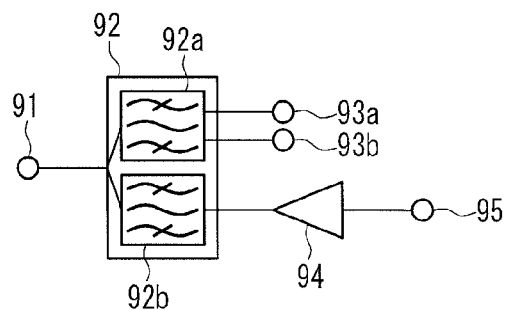
FIG. 26 is a block diagram of an example of a communication module.

FIG. 26 shows an example of a communication module including the duplexer according to the present embodiment. As shown in FIG. 26, a duplexer 92 includes a receiving filter 92*a* and a transmitting filter 92*b*. Further, to the receiving filter 92*a*, receiving terminals 93*a* and 93*b* compatible with balanced output are connected, for example. Further, the transmitting filter 92*b* is connected to a transmitting terminal 95 through a power amplifier 94. Here, the duplexer according to the present embodiment can be used as the duplexer 92.

Of reception signals inputted through an antenna terminal 91, only signals in a certain frequency band are allowed to pass through the receiving filter 92*a* during the reception operation, and they are outputted externally from the receiving terminals 93*a* and 93*b*. Further, of transmission signals inputted from the transmitting terminal 95 and amplified by the power amplifier 94, only signals in a certain frequency band are allowed to pass through the transmitting filter 92*b* during the transmission operation, and they are outputted externally from the antenna terminal 91.

By incorporating the duplexer according to the present embodiment into the communication module, the communication module with improved isolation can be achieved without substantially increasing the size.

Note that the configuration of the communication module shown in FIG. 26 is merely an example. Even if the duplexer according to the present embodiment is incorporated into a communication module in other form, the same effects can be achieved.

[3. Configuration Example of Communication Device]

Figure 27:
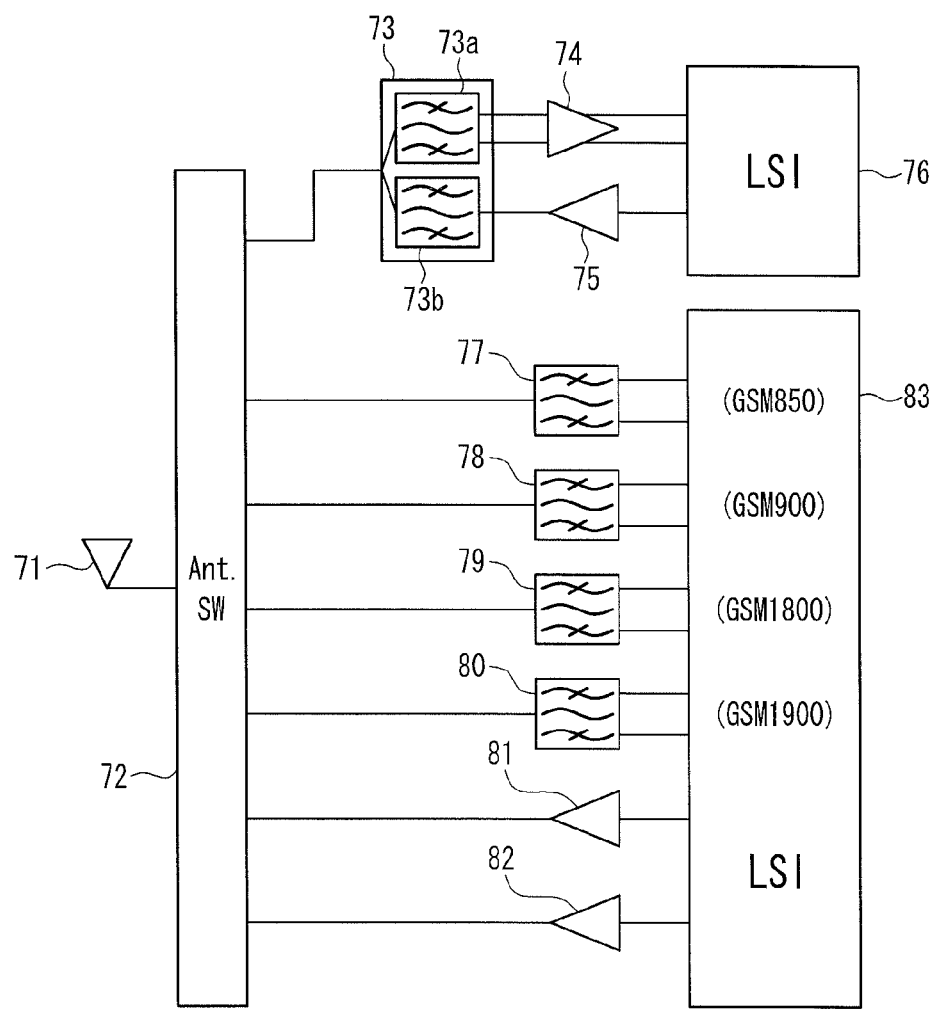
FIG. 27 is a block diagram of an example of a communication device.

FIG. 27 shows an RF block of a mobile phone terminal as an example of a communication device including the duplexer according to the present embodiment or the communication module as described above. The communication device whose configuration is shown in FIG. 27 can be, for example, a mobile phone terminal compatible with the GSM (Global System for Mobile Communications) communication system and the W-CDMA (Wideband Code Division Multiple Access) communication system. The GSM communication system in the present embodiment can support, for example, 850 MHz, 950 MHz, 1.8 GHz and 1.9 GHz bands. In addition to the components shown in FIG. 27, the mobile phone terminal may also include a microphone, a speaker, a liquid crystal display and the like but these components are not illustrated because they are irrelevant to the description of the present embodiment. Here, the duplexer according to the present embodiment is used as a duplexer 73.

First, an antenna switching circuit 72 selects an LSI to be operated based on the communication system of reception signals inputted thereto through an antenna 71, i.e., based on whether the communication system is W-CDMA or GSM. When the inputted reception signals correspond to the W-CDMA communication system, switching is performed to output the reception signals to the duplexer 73. The reception signals inputted to the duplexer 73 are limited to those in a certain frequency band through a receiving filter 73a, so that balanced reception signals are outputted to a LNA 74. The LNA 74 amplifies the inputted reception signals and outputs the amplified reception signals to an LSI 76. Based on the inputted reception signals, the LSI 76 decodes the signals into audio signals and controls the operation of each portion of the mobile phone terminal.

On the other hand, when transmitting signals, the LSI 76 produces transmission signals. The transmission signals produced are amplified by the power amplifier 75 and are inputted to the transmitting filter 73b. Of the transmission signals inputted to the transmitting filter 73b, only signals in a certain frequency band are allowed to pass therethrough. The transmission signals outputted from the transmitting filter 73b are outputted externally from the antenna 71 through the antenna switching circuit 72.

Further, when the inputted reception signals are signals corresponding to the GSM communication system, the antenna switching circuit 72 selects one of receiving filters 77 to 80 based on the frequency band of the signals, and outputs the reception signals to the selected receiving filter. The reception signals whose bands are limited by one of the receiving filters 77 to 80 are inputted to an LSI 83. Based on the inputted reception signals, the LSI 83 decodes the signals into audio signals and controls the operation of each portion of the mobile phone terminal. On the other hand, when transmitting signals, the LSI 83 produces transmission signals. The transmission signals produced are amplified by a power amplifier 81 or 82 and are outputted externally from the antenna 71 through the antenna switching circuit 72.

By incorporating the duplexer or the communication module according to the present embodiment into the communication device, the communication device with improved isolation can be achieved without substantially increasing the size.

Note that the configuration of the communication device shown in FIG. 27 is merely an example. Even if the duplexer according to the present embodiment is incorporated into a communication device in other form, the same effects can be achieved.

[4. Effects of Embodiment, etc.]

According to the present embodiment, the isolation between the transmitting filter and the receiving filter can be improved by electrostatically coupling the transmitting port and the receiving port. Further, since an electrostatic coupling between the transmitting port and the receiving ports can be achieved by, for example, electrically connecting the transmitting port and the receiving ports through an element such as a capacity, an inductor or the like, a duplexer can be achieved without substantially increasing the size. According to the disclosure of the present application, it is possible to achieve a simple duplexer with good isolation.

The present invention is not limited to the specific examples described above in detail. The present invention may be changed or modified within the scope of the appended claims.

The following notes are disclosed with respect to the present embodiment.

(Note 1)

A duplexer including: an unbalanced transmitting filter; a balanced receiving filter; a transmitting port connected to the transmitting filter; a first receiving port connected to the receiving filter; a second receiving port connected to the receiving filter; and an electrostatic coupling portion connected between the transmitting port and the first receiving port and between the transmitting port and the second receiving port, the electrostatic coupling portion allowing phase-adjusted electric power to flow from the transmitting port to the first receiving port and from the transmitting port to the second receiving port.

According to the above configuration, it is possible to cancel the deterioration of the isolation caused by a coupling between the transmitting port and the receiving ports through space. Therefore, for example, a simple duplexer with high isolation can be achieved without increasing the space between the transmitting port and the receiving ports or additionally providing an electromagnetic shielding structure.

(Note 2)

The duplexer according to Note 1, wherein the electrostatic coupling portion adjusts the phase of electric power such that electric power that flows from the transmitting port to the first receiving port and electric power that flows from the transmitting port to the second receiving port have an absolute phase difference in a range of 0 to 90° or 270 to 360° in the receiving band.

(Note 3)

The duplexer according to Note 1 or 2, wherein the electrostatic coupling portion provides an electrostatic coupling between the transmitting port and the first receiving port and an electrostatic coupling between the transmitting port and the second receiving port at the same degree.

According to the above configurations, it is possible to achieve a duplexer with higher isolation.

(Note 4)

The duplexer according to any one of Note 1 to 3, wherein the electrostatic coupling portion is composed of a conductor.

According to the above configuration, it is possible to achieve a duplexer with higher isolation without making significant changes to the structure of the duplexer.

(Note 5)

The duplexer according to any one of Notes 1 to 3, wherein the electrostatic coupling portion includes a capacitative element.

According to the above configuration, it is possible to achieve a duplexer with higher isolation without making significant changes to the structure of the duplexer.

(Note 6)

The duplexer according to any one of Notes 1 to 3, wherein the electrostatic coupling portion includes an impedance-matching inductor.

According to the above configuration, it is possible to achieve a duplexer with higher isolation without making significant changes to the structure of the duplexer.

(Note 7)

A communication module including a duplexer, the duplexer including: an unbalanced transmitting filter; a balanced receiving filter; a transmitting port connected to the transmitting filter; a first receiving port connected to the receiving filter; a second receiving port connected to the receiving filter; and an electrostatic coupling portion connected between the transmitting port and the first receiving port and between the transmitting port and the second receiving port, the electrostatic coupling portion allowing phase-adjusted electric power to flow from the transmitting port to the first receiving port and from the transmitting port to the second receiving port.

According to the above configuration, it is possible to cancel the deterioration of the isolation caused by a coupling between the transmitting port and the receiving ports through space. Therefore, for example, a communication module including a simple duplexer with high isolation can be achieved without increasing the space between the transmitting port and the receiving ports or additionally providing an electromagnetic shielding structure.

(Note 8)

A communication device including a duplexer, the duplexer including: an unbalanced transmitting filter; a balanced receiving filter; a transmitting port connected to the transmitting filter; a first receiving port connected to the receiving filter; a second receiving port connected to the receiving filter; and an electrostatic coupling portion connected between the transmitting port and the first receiving port and between the transmitting port and the second receiving port, the electrostatic coupling portion allowing phase-adjusted electric power to flow from the transmitting port to the first receiving port and from the transmitting port to the second receiving port.

According to the above configuration, it is possible to cancel the deterioration of the isolation caused by a coupling between the transmitting port and the receiving ports through space. Therefore, for example, a communication device including a simple duplexer with high isolation can be achieved without increasing the space between the transmitting port and the receiving ports or additionally providing an electromagnetic shielding structure.

The present application is useful for a duplexer, a communication module, and a communication device.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

The invention claimed is:

1. A duplexer comprising:
   an unbalanced transmitting filter;
   a balanced receiving filter;
   a transmitting port connected to the transmitting filter;
   a first receiving port connected to the receiving filter;
   a second receiving port connected to the receiving filter; and
   an electromagnetic coupling portion connected between the transmitting port and the first receiving port and between the transmitting port and the second receiving port, the electromagnetic coupling portion allowing phase-adjusted electric power to flow from the transmitting port to the first receiving port and from the transmitting port to the second receiving port.

2. The duplexer according to claim 1, wherein the electromagnetic coupling portion adjusts a phase of electric power such that electric power that flows from the transmitting port to the first receiving port and electric power that flows from the transmitting port to the second receiving port have an absolute phase difference in a range of 0 to 90° or 270 to 360° in a receiving band.

3. The duplexer according to claim 1, wherein the electromagnetic coupling portion provides an electromagnetic coupling between the transmitting port and the first receiving port and an electromagnetic coupling between the transmitting port and the second receiving port at the same degree.

4. The duplexer according to claim 1, wherein the electromagnetic coupling portion is composed of a conductor.

5. A communication module comprising a duplexer,
   the duplexer comprising:
   an unbalanced transmitting filter;
   a balanced receiving filter;
   a transmitting port connected to the transmitting filter;
   a first receiving port connected to the receiving filter;
   a second receiving port connected to the receiving filter; and
   an electromagnetic coupling portion connected between the transmitting port and the first receiving port and between the transmitting port and the second receiving port, the electromagnetic coupling portion allowing phase-adjusted electric power to flow from the transmitting port to the first receiving port and from the transmitting port to the second receiving port.

6. A communication device comprising a duplexer,
   the duplexer comprising;
   an unbalanced transmitting filter;
   a balanced receiving filter;
   a transmitting port connected to the transmitting filter;
   a first receiving port connected to the receiving filter;
   a second receiving port connected to the receiving filter; and
   an electromagnetic coupling portion connected between the transmitting port and the first receiving port and between the transmitting port and the second receiving port, the electromagnetic coupling portion allowing phase-adjusted electric power to flow from the transmitting port to the first receiving port and from the transmitting port to the second receiving port.

* * * * *